US012663399B2

(12) United States Patent
Nicholas

(10) Patent No.: US 12,663,399 B2
(45) Date of Patent: Jun. 23, 2026

(54) SYSTEM AND METHOD FOR MODULATING ELECTRICAL PROCESSES IN CONTACT WITH A CONDENSED PHASE

(71) Applicant: Nolan Walker Nicholas, West Lafayette, IN (US)

(72) Inventor: Nolan Walker Nicholas, West Lafayette, IN (US)

( * ) Notice: Subject to any disclaimer, the term of this patent is extended or adjusted under 35 U.S.C. 154(b) by 526 days.

(21) Appl. No.: 17/903,299

(22) Filed: Sep. 6, 2022

(65) Prior Publication Data

US 2023/0071676 A1 Mar. 9, 2023

Related U.S. Application Data

(60) Provisional application No. 63/240,948, filed on Sep. 5, 2021.

(51) Int. Cl.
*G01N 27/414* (2006.01)
*H10D 48/36* (2025.01)

(52) U.S. Cl.
CPC ......... *G01N 27/4145* (2013.01); *H10D 48/36* (2025.01)

(58) Field of Classification Search
CPC ........... G01N 27/4145; G01N 27/4146; H01L 29/76; H01L 29/1606; H01L 29/778
See application file for complete search history.

(56) References Cited

U.S. PATENT DOCUMENTS

2017/0059514 A1* 3/2017 Hoffman ............ G01N 33/5438
2018/0035934 A1* 2/2018 Kiani ...................... H10D 86/01
2019/0131555 A1* 5/2019 Doris ...................... H10K 19/10
2020/0209189 A1* 7/2020 Davis ................... G01N 27/414
2021/0088463 A1* 3/2021 Balijepalli ............. G01N 27/12
2022/0131529 A1* 4/2022 Goossens ............. H10D 62/882

OTHER PUBLICATIONS

Fu et al., Sensing at the surface of graphene field-effect transistors, Advanced Materials, 2017, 29, 1603610 (Year: 2017).*
Wen et al., Chapter 7, Graphene field-effect transistor for terahertz modulation, DOI: 10.5772/intechopen.76744, 2018, p. 117-133 (Year: 2018).*

(Continued)

*Primary Examiner* — Shizhi Qian
(74) *Attorney, Agent, or Firm* — Pandiscio & Pandiscio

(57) ABSTRACT

A device for interacting with a quantity of a sample, the device, comprising: a substrate comprising a first surface and a second surface, wherein the first surface is opposite to the second surface; an electrically-thin conductive layer disposed on the first surface of the substrate and configured to contact a first portion of the sample; a buried electrode disposed on the second surface of the substrate, the buried electrode being capacitively coupled with the electrically-thin conductive layer; and at least one electrode in contact with a second portion of the sample, wherein the second portion of the sample is remote from the first portion of the sample, and further wherein the at least one electrode and the electrically-thin conductive layer electrically interact via the sample; wherein the substrate is configured such that the substrate does not substantially conduct the flow of electric current through the electrically-thin conductive layer.

22 Claims, 10 Drawing Sheets

(56) References Cited

OTHER PUBLICATIONS

Nguyen et al., Triggering the electrolyte-gated organic field-effect transistor output characteristics through gate functionalization using diazonium chemistry: application to biodetection of 2,4-dichlorophenoxyacetic acid, Biosensors and Bioelectronics, 2018, 113, 32-38 (Year: 2018).*

Tsang et al., Chemically Functionalised Graphene FET Biosensor for the Label-free Sensing of Exosomes, Scientific Reports, 2019, 9, 13946 (Year: 2019).*

Hao et al., Graphene-based fully integrated portable nanosensing system for on-line detection of cytokine biomarkers in saliva, Biosensors and Bioelectronics, 2019, 134, 16-23 (Year: 2019).*

Hwang et al., Ultrasensitive detection of nucleic acids using deformed graphene channel field effect biosensors, Nature communications, 2020, 11, 1543 (Year: 2020).*

Liao et al., Flexible organic electrochemical transistors for highly selective enzyme biosensors and used for saliva testing, Advanced Materials, 2014, DOI: 10.1002/adma.201404378 (Year: 2014).*

Xia et al., Graphene field-effect transistors with on/off current ratio and large transport band gap at room temperature, Nano Letters, 2010, 10, 715-718 (Year: 2010).*

Ahn et al., Understanding the signal amplification in dual-gate FET-based biosensors, J. Appl. Phys., 2020, 128, 184502 (Year: 2020).*

Spijkman et al., Dual-Gate Thin-Film Transistors, Integrated Circuits and Sensors, Advanced Materials, 2011, 23, 3231-3242 (Year: 2011).*

* cited by examiner

SYSTEM AND METHOD FOR MODULATING ELECTRICAL PROCESSES IN CONTACT WITH A CONDENSED PHASE

REFERENCE TO PENDING PRIOR PATENT APPLICATION

This patent application claims benefit of prior U.S. Provisional Patent Application Se. No. 63/240,948, filed Sep. 5, 2021 by Nolan Walker Nicholas for SYSTEM AND METHOD FOR MODULATING ELECTRICAL PROCESSES IN CONTACT WITH A LIQUID PHASE. The above-identified patent application is hereby incorporated herein by reference.

FIELD OF THE INVENTION

The present disclosure relates to the technical field of electrical devices and electrical devices which interact with their physical environment. The present disclosure also relates to the technical field of sensing devices and chemical sensing devices. The present disclosure also relates to the technical field chemical reactions. The present disclosure also relates to the technical field of electrochemical devices and electrochemically driven reactions and, in particular, to affecting, controlling, and/or directing various reactions and/or reaction pathways and/or system dynamics in an electrochemical cell.

BACKGROUND OF THE INVENTION

Various methods exist for transducing information about a liquid chemical environment including systems wherein an electrical device is in contact with, and senses, chemical information about its environment including chemiresistor, chemical field-effect transistor (chemFET), and electrochemical devices. In traditional chemFET and electrochemical devices, there is commonly a combination of a sensing electrode body and one or more counter electrodes in contact with a sample liquid to perform the sensing process. A voltage, which is maintained by this combination of electrodes, in conjunction with local chemical conditions, determines both the population of electronic states within the electrode as well as the conditions of electric fields between, and within, the liquid and the sensing electrode. Using voltage to determine both the population of electronic states within the electrode and the conditions of the electric field between, and within, the liquid and the sensing electrode is limiting to various aspects of the process of chemical sensing by such devices.

In traditional electrochemical systems, the dynamics of the electrochemical processes is essentially controlled by the potential difference maintained between two or more electrodes in electrical contact with a solution. This applied potential acts in conjunction with the surface chemistry and electronic characteristics of these electrodes to significantly determine the dynamics of the electrochemical process of the solution in the cell. Using the potential difference between two or more electrodes in electrical contact with a solution to control the dynamics of the electrochemical process limits the various aspects of control which can be applied to electrochemical processes and electrochemical device dynamics.

Accordingly, there is a need for improved systems, methods, and devices for transducing information about a liquid or other condensed phase chemical environment.

SUMMARY OF THE INVENTION

The present disclosure provides novel systems and methods for altering the dynamics of local electrical transport properties, chemical dynamics, and the behavior of electrical devices which are in contact with a condensed phase, such as a liquid phase or a solid phase, through the application of one or more additional electrodes to the electrical device. In some embodiments, said condensed phase comprises a test sample. A test sample includes an analyte, which is a particular substance of the test sample under test, such as biological specimens. In some embodiments, the test sample includes more than one analyte. In some embodiments, the condensed phase comprises a condensed phase with a chemistry that is coupled to the electrical processes of the device. For the sake of brevity, in general this condensed phase may also be referred to herein as a test solution. The additional electrodes can be out of direct electrical contact with the liquid phase but interact electrostatically with the components of the electrical device system. Further, the electrostatically coupled electrode or electrodes can be utilized to modify the electrical transport processes and dynamics active in the remainder of the system.

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims.

In one preferred form of the present invention, there is provided a device for interacting with a quantity of a sample, the device, comprising:

a substrate comprising a first surface and a second surface, wherein the first surface is opposite to the second surface;

an electrically-thin conductive layer disposed on the first surface of the substrate and configured to contact a first portion of the sample;

a buried electrode disposed on the second surface of the substrate, the buried electrode being capacitively coupled with the electrically-thin conductive layer; and at least one electrode in contact with a second portion of the sample, wherein the second portion of the sample is remote from the first portion of the sample, and further wherein the at least one electrode and the electrically-thin conductive layer electrically interact via the sample;

wherein the substrate is configured such that the substrate does not substantially conduct the flow of electric current through the electrically-thin conductive layer.

In another preferred form of the present invention, there is provided a method for interacting with a quantity of a sample, the method comprising:

providing a device comprising:

a substrate comprising a first surface and a second surface, wherein the first surface is opposite to the second surface;

an electrically-thin conductive layer disposed on the first surface of the substrate and configured to contact a first portion of the sample;

a buried electrode disposed on the second surface of the substrate, the buried electrode being capacitively coupled with the electrically-thin conductive layer; and at least one electrode in contact with a second portion of the sample, wherein the second portion of the sample is remote from the first portion of the sample, and further wherein the at least one electrode and the electrically-thin conductive layer electrically interact via the sample;

wherein the substrate is configured such that the substrate does not substantially conduct the flow of electric current between the electrically-thin conductive layer and the buried electrode; and applying an electrical signal simultaneously to any combination of the buried electrode, the electrically-thin conductive layer, and the at least one electrode in contact with the second portion of the sample.

In another preferred form of the present invention, there is provided a method for performing an electrochemical process in which a redox potential of a working electrode is substantially decoupled from properties of an electric double layer at a surface of the working electrode.

In another preferred form of the present invention, there is provided a method for testing a sensor, the method comprising:

applying an electrical signal to at least one of a buried gate electrode and a graphene channel of a sensor prior to exposing the sensor to a liquid sample; and determining one or more electrical signal parameters to optimize performance of the sensor;

wherein the buried gate electrode is separated from the graphene channel by a dielectric insulator and the liquid gate electrode is positioned remote from the graphene channel on an opposite side of the graphene channel from the buried gate electrode.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features as the person of skill in this art will appreciate upon reading this disclosure.

FIG. 10 is a diagram of molecular linker species according to the present invention.

Figure 1:
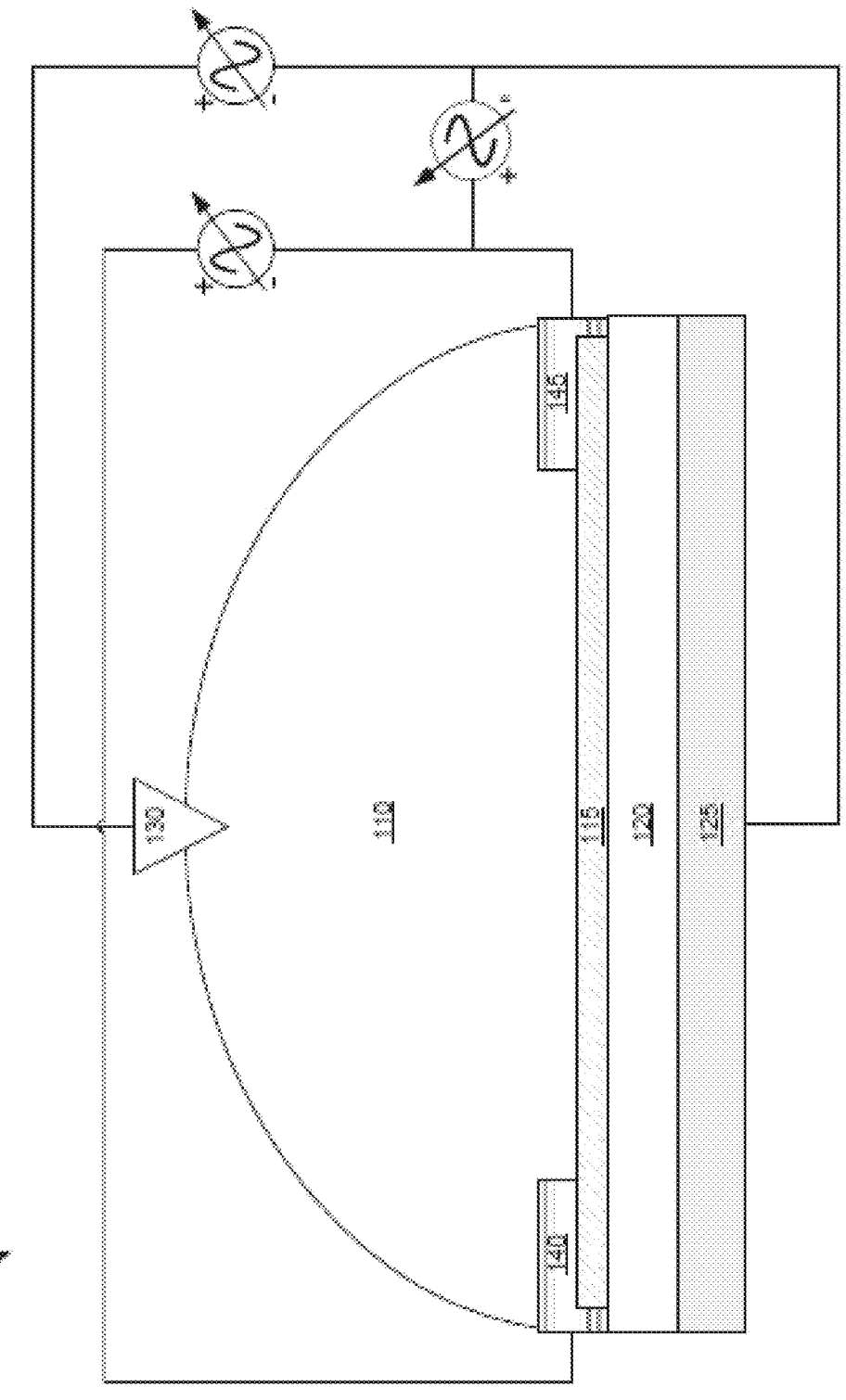
FIG. 1 is a diagram of a first embodiment of a device according to the present invention.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION OF THE PREFERRED EMBODIMENTS

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as to avoid obscuring pertinent aspects of the embodiments described herein.

The present disclosure describes novel systems and methods for controlling the electrical transport processes, chemical dynamics, and performance dynamics for an electrical device in contact with a test solution. In some embodiments, the system includes one or more electrodes, with at least two electrodes in direct electrical contact with the test solution. In some embodiments, the system includes one or more electrodes with at least one electrode in physical contact with the test solution and capacitively coupled to the solution without exchanging charge carriers. In some embodiments, at least one electrode is in electrostatic, but not direct, electrical contact with the test solution, wherein the electrostatic contact occurs via penetration of an electric field through one of the electrodes in contact with the test solution. Or via the other electrodes that are in direct electrical contact with the test solution. "Direct electrical contact" can refer to the ability to directly exchange a charge carrier between the two components. Further, the electrostatically coupled electrode or electrodes can be utilized to modify the electrical and chemical dynamics active in the remainder of the system.

FIG. 1 illustrates a device 100 for interacting with a test solution, in accordance with the present invention. In some embodiments, the interactions may take the form of performing measurements on said test solution which may be referred to as "screening". Although the interaction of device 100 with the test solution may often be referred to as a "screening" in the context of a particular embodiment, it should be understood by those skilled in the art that device 100 may also interact with the test solution in other particular ways, including those described below, without loss of generality. In some embodiments of device 100, device 100 can be provided in the form of a chemFET-type device, an electrochemical-FET-type (EChemFET), or an electrochemical-type device.

In some embodiments, device 100 includes a test solution 110 (also referred to as a test sample), a thin conductive layer 115, one or more electrodes, and an intermediate material layer 120 (e.g., a non-conductive substrate). The one or more electrodes include a "back" or "buried" gate electrode 125, a liquid gate electrode 130, a source electrode 140, and a drain electrode 145. In some embodiments, the source electrode 140 or the drain electrode 145 are optional. Each of the components of the first embodiment 100 are discussed below.

In some embodiments, test solution 110 is a condensed phase, such as a liquid phase or a solid phase (or multiple such liquid or solid phases). Additionally, or alternatively, in some embodiments, test solution 110 is an electrolyte solution, such as an aqueous salt solution or an ionic liquid or another solution that conducts electrical current as an ionized chemical species. In some embodiments, test solution 110 is a substantially conductive solution. Test solution 110 directly contacts thin conductive layer 115 and a subset of the one or more electrodes. For example, as shown in FIG. 1, test solution 110 directly contacts thin conductive layer 115, liquid gate electrode 130, source electrode 140, and drain electrode 145. As charges within the test solution 110 change (as will be discussed in further detail below), different information corresponding to an analyte (i.e., the particular substance of test solution 110 under test, such as biological specimens) can be detected.

In some embodiments, thin conductive layer 115 is a conductive metallic or quasi-metallic or semiconducting material. A "thin layer", for purposes of this disclosure, in some embodiments, refers to a layer thickness in which the density of charge carriers and associated quantum capacitance within the material evaluated over relevant voltages is such that a substantial amount of electrical field penetrates through the layer rather than terminating within the layer. In some embodiments, this may be less than $10^{\wedge}14$ carriers per $cm^{\wedge}2$. In some embodiments, this may be around $10^{\wedge}13$ carriers per $cm^{\wedge}2$. In some embodiments, this may be around $10^{\wedge}12$ carriers per $cm^{\wedge}2$ or less. Thin conductive layer 115 can be any conductive material that includes a threshold amount of carrier density (which is in general correlated to a threshold amount of finite quantum capacitance possessed by the thin conductive layer) and performs as a conducting electrical channel and/or as an electrochemical electrode. Electrically "thin" density-of-states limited conducting materials can possess the particular property of (i) providing conduction of charge carriers through the material, and not completely screening electrical fields incident on the material, and (ii) allowing electrical charges to "penetrate" or "bleed through" the electrically "thin" conductor to the other side from which the electrical field is applied. In some embodiments, it is advantageous for the electrically thin electrode to be formed physically thin (e.g., as a monolayer) so that the density of charge carriers present at the top and bottom of the electrode are substantially the same. In some embodiments, thin conductive layer 115 is electrically coupled to source electrode 140 and drain electrode 145. In some embodiments, thin conductive layer 115 is configured to operate as an "active electrode." In other words, thin conductive layer 115 may be configured as a working electrode for an electrochemical cell and/or a sensing channel, as described herein.

In some embodiments, thin conductive layer 115 is a graphene channel. In some embodiments, thin conductive layer 115 includes thin layers of graphene or graphene-like materials such as monolayer graphene, double-layer graphene, multi-layer graphene, graphene-oxide, reduced graphene oxide, disordered graphenic carbon, substitution doped graphene (e.g. N-atom-substituted graphene), graphene nanoplatelets (e.g., including edge-halogenated nanoplatelets), functionalized graphene, graphene which is doped by physical contact with a suitable substrate (e.g., graphene-on-amine), films (or ribbons or arrays) of carbon nanotubes, MXenes, etc. In some embodiments, thin conductive layer 115 includes thin layers of semi-conducting material, such as organic semiconductors, silicon, germanium, etc. While thin conductive layer 115 is often referred to herein as a graphene channel, it will be understood by those skilled in the art that thin conductive layer 115 may also be constructed using other materials (such as those described above) without loss of generality. If desired, a plurality of electrical leads may be coupled to the graphene channel provided by thin conductive layer 115. The plurality of electrical leads may be configured to form ohmic contacts with the graphene channel provided by thin conductive layer 115. If desired, one or more of the electrical leads may be coated with an insulating layer.

In some embodiments, thin conductive layer 115 includes architectures constructed from a plurality of materials. For example, as graphene that has been decorated with one or more chemical species in order to perform one or more functions. Such chemical species may include sensitizer molecules for sensing applications, (e.g., antibodies for conferring molecular-recognition functions for specific sensing); passivation layers (e.g., surfactant or polyethylene-oxide moieties to prevent non-specific interaction to improve sensing specificity); and permittivity reduction layers to increase the length of charge double-layer strength to increase the distance at which the surface can interact with a molecule. Various chemical species can confer molecular recognition functions, such as antibodies, aptamers, molecular imprinted polymers, and macrocycles, such as phthalocyanines, porphyrins, etc. Such chemical species may include catalytic species for electrochemical applications. It should also be appreciated that, if desired, the aforementioned sensitizer molecules may be non-covalently coupled to the graphene channel provided by thin conductive layer 115. By way of example but not limitation, the sensitizer molecules may be non-covalently coupled to the graphene channel by a pi-stacking molecule. And it should also be appreciated that where a macrocycle is coupled to the graphene channel it may be coupled via direct physisorption.

Intermediate material layer 120 is disposed between thin conductive layer 115 and buried gate electrode 125, as well as between buried gate electrode 125 and source electrode 140 and drain electrode 145. In some embodiments, intermediate material layer 120 is a dielectric material. In some embodiments, intermediate material layer 120 is a dielectric insulator spacer. In some embodiments, intermediate material layer 120 is hafnium oxide, tantalum oxide, aluminum oxide, silicon oxide, or similar material. Intermediate material layer 120 is configured to insulate buried gate electrode 125 from test solution 110.

Buried gate electrode 125 is in contact with intermediate material layer 120. In some embodiments, buried gate electrode 125 is made from metal or highly doped silicon. In some embodiments, buried gate electrode 125 is not in direct electrical contact with test solution 110 or with thin conductive layer 115, but can be in electrostatic contact with test solution 110 and with thin conductive layer 115 (e.g., via thin conductive layer 115) because the electrostatic field of the backing electrode can be incompletely screened from test solution 110 due to the quantum capacitance of thin conductive layer 115. In some embodiments, buried gate electrode 125 is used to modulate the transfer of electrons between thin conductive layer 115 and test solution 110 (e.g., electrochemistry) in order to enable additional processes useful for sensing and other applications (additional details are provided below in reference to FIGS. 3-5). The dynamics of this electrochemical process can be modulated by applying an additional potential to buried gate electrode 125. The electrical potential applied to buried gate electrode 125 relative to thin conductive layer 115 and liquid gate electrode 130 alters the dynamics of the electrochemical process, as will be explained in more detail below. If desired, buried gate electrode 125 and/or intermediate material layer 120 may be configured such that buried gate electrode 125 provides substantially constant capacitance with the graphene channel provided by thin conductive layer 115 across the surface area of the graphene channel. Alternatively, if desired, buried gate electrode 125 may be configured to provide substantially greater capacitive coupling to some portions of the graphene channel provided by thin conductive layer 115 relative to other portions of the graphene channel.

Liquid gate electrode 130 is in contact with test solution 110. Liquid gate electrode 130 provides an electrical potential that "flows" through test solution 110. The electrical potential provided by liquid gate electrode 130 can be used in conjunction with buried gate electrode 125 to modulate thin conductive layer 115. In some embodiments, source electrode 140 the drain electrode 145 are electrical contacts that are used to provide an electrical potential across and within the plane of active thin conductive layer 115. More specifically, source electrode 140 and drain electrode 145 are electrical contacts to thin conductive layer 115 through which electrical transport may be maintained across thin conductive layer 115. In some embodiments, one or more of the electrodes (e.g., source electrode 140 and/or drain electrode 145) are passivated or encapsulated to prevent them from direct interaction with the test solution. Additionally, and/or alternatively, if desired, liquid gate electrode 130 may be passivated or encapsulated.

Figure 2:
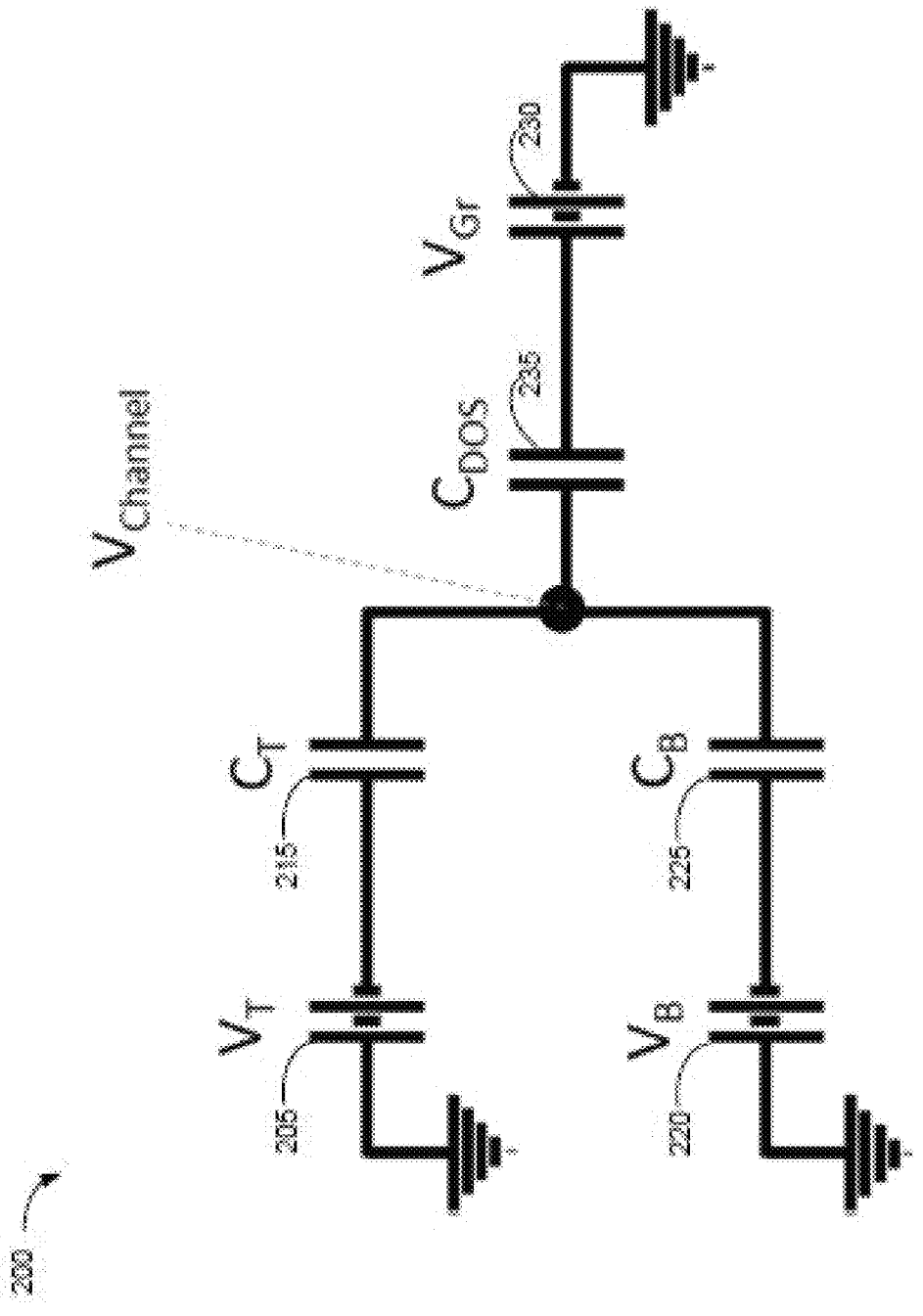
FIG. 2 is a circuit diagram of one embodiment of a device according to the present invention.

FIG. 2 illustrates a representation of the architecture of a device for screening a test solution 110 described above in reference to FIG. 1, in accordance with the present invention. In some embodiments, the architecture is represented as a system 200 including three capacitors ($C_T$ 215, $C_B$ 225, and $C_{DOS}$ 235. The three capacitors 215, 225, and 235 are used to determine the voltage (or chemical potential of the electrons) within thin conductive layer 115 (FIG. 1). The system can be expressed by the following formulae:

$$V_{Channel} = \left(\frac{C_T}{C_{Tot}}\right)V_T + \left(\frac{C_{DOS}}{C_{Tot}}\right)V_{Gr} + \left(\frac{C_B}{C_{Tot}}\right)V_B \qquad (1)$$

$$\text{Where } C_{Tot} = C_T + C_{DOS} + C_B \qquad (2)$$

$V_{Gr}$ is the voltage of electrons within thin conductive layer 115, not the voltage drop across thin conductive layer 115 (e.g. not the voltage drop from source electrode 140 to drain electrode 145).

Because the density-of-states of thin conductive layer 115 commonly varies as a function of applied voltage, quantum capacitance (CDOS) of thin conductive layer 115 also varies as a function of voltage. For graphene, this is typically modeled with a formula of the following form:

$$C_{DOS}=k_1\ln[2(1+\cos h[k_2V_{Gr}])] \qquad (3)$$

Where $k_1$ and $k_2$ are constants and the curve is centered around a Dirac point.

$C_T$ 215 arises through the interaction with test solution 110 (FIG. 1). In some embodiments, $C_T$ 215 is the result of two capacitance terms in series including an electric double layer capacitance at thin conductive layer 115 and another electric double layer capacitance at liquid gate electrode 130 (FIG. 1). In some embodiments, $C_T$ 215 is substantially constant for voltages below a threshold for electron transfer between thin conductive layer 115 and test solution 110 and/or between liquid gate electrode 130 and test solution 110. In some embodiments, $C_T$ 215 is based on one or more parameters, such as electrolyte strength and frequency of an applied electric field (described below). $C_B$ 225 is based on the capacitance of the bottom layer or buried gate electrode 125 (FIG. 1) to the conductive layer 115 and test solution beyond 110.

In some embodiments, an electric double layer results as a function of the difference in charge between thin conductive layer 115 and test solution 110. In some embodiments, additional factors also contribute to the difference in charge between thin conductive layer 115 and test solution 110 (e.g., the selective physisorption of species to thin conductive layer 115 from test solution 110). In some embodiments, the electric double layer is modified by an electric field "bleeding through" thin conductive layer 115 from buried gate electrode 125 below thin conductive layer 115. An electric field bleeds through thin conductive layer 115 from buried gate electrode 125 due to the finite screening due to the limited charge density and density-of-states within thin conductive layer 115, which is captured by the voltage drop across $C_T$ 215 (where, in some embodiments, $C_T$ 215 represents two capacitors in series), and more particularly represents the voltage drop between $V_{Channel}$ and the voltage within the bulk liquid mediated by the relative voltage on liquid gate electrode 130. In some embodiments, the voltage drop between $V_{Channel}$ and the voltage within the bulk liquid mediated by the relative voltage on liquid gate electrode 130 is additionally a function of the particular structure, chemistry, and surface area of the electrodes in contact with test solution 110.

For example, for a simple case where surface chemistry can be ignored and the electrical surface area of liquid gate electrode 130 is equivalent to that of thin conductive layer 115, double-layer-free cases can be produced at thin conductive layer 115 with $V_T$ maintained in correspondence with $V_{Channel}$ so that no electric field exists between thin conductive layer 115 and test solution 110. By using the relationship for the relative voltages and the capacitance for each element, potentials suitable to achieve this case can be applied and thereby eliminate the double layer at thin conductive layer 115 while also maintaining thin conductive layer 115 at a desired level of charge (relative to the Dirac point). Or, similarly, a set of potentials may be applied suitable to enhance the double layer while also maintaining thin conductive layer 115 at a desired level of charge (relative to the Dirac point). This can enable the electrical state of thin conductive layer 115 to be substantially decoupled from test solution 110 to enable operational states that are not possible with prior art devices (e.g., with prior art devices lacking buried gate electrode 125).

As will be explained in more detail below, a common operational mode of the devices disclosed herein can be to maintain defined relative potentials between thin conductive layer 115, liquid gate electrode 130 (or counter electrode(s)), and buried gate electrode 125. The relative potentials maintained can be used to modulate the state of thin conductive layer 115 and test solution 110 and the interactions between the two. In particular, this can be used to de-couple the amount of charge in thin conductive layer 115 and the electric field present in test solution 110 particularly at the interface of test solution 110 and thin conductive layer 115 and, more particularly, at the liquid-electrolyte interface, whereby to permit control over screening effects and maximize the effectiveness of processes such as sensing interactions.

Figure 3:
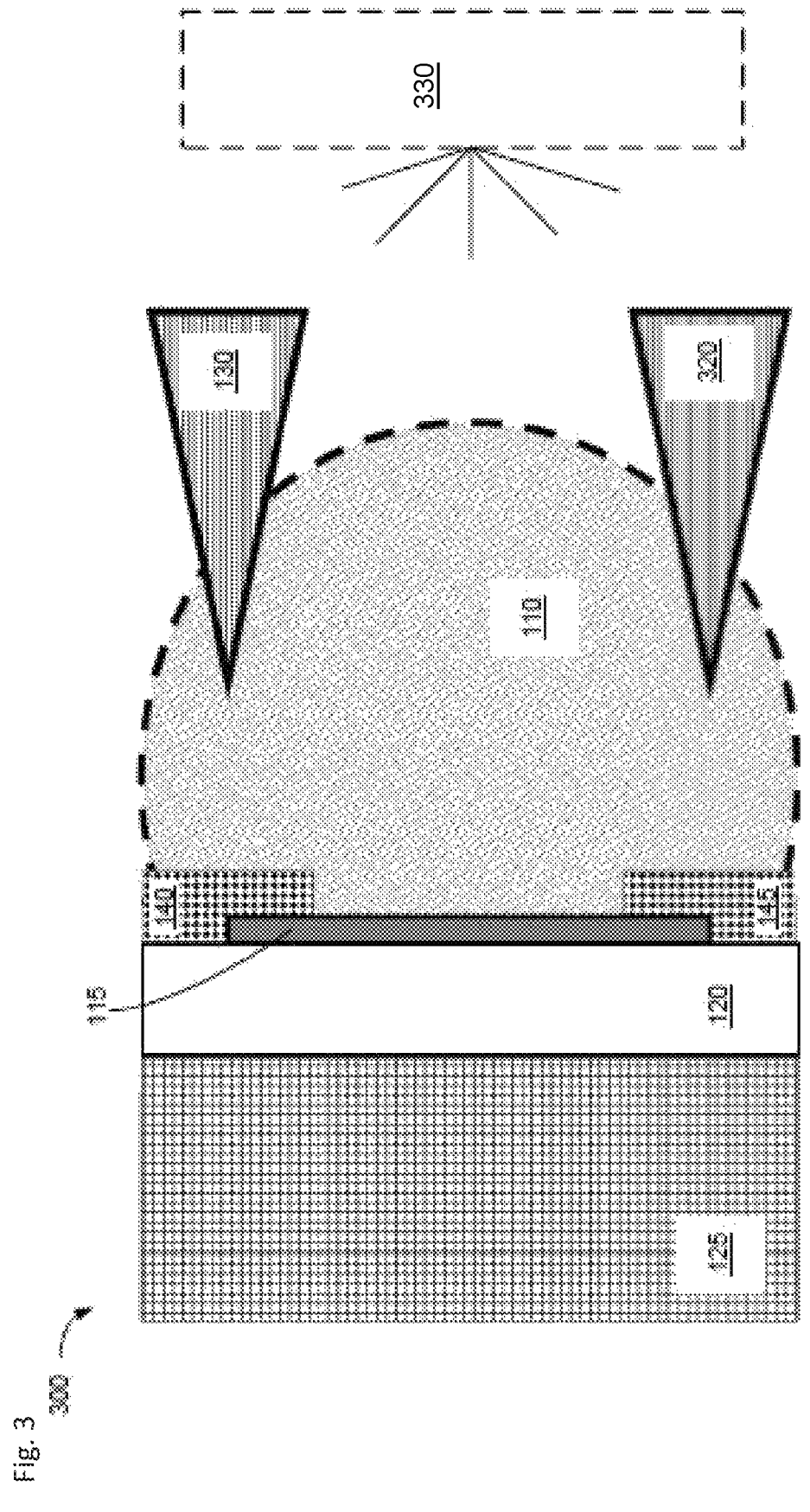
FIG. 3 is a diagram of a second embodiment of a device according to the present invention.

FIG. 3 illustrates a device 300 for screening a test solution, in accordance with the present invention. Device 300 is similar to device 100 in that device 300 comprises a test solution 110 (also referred to as a test sample), a thin conductive layer 115, one or more electrodes, and an intermediate material layer 120 (e.g., a non-conductive substrate). Like device 100, the one or more electrodes of device 300 include a buried gate electrode 125, a source electrode 140, a drain electrode 145, and a liquid gate electrode 130, however, the one more electrodes of device 300 preferably also include a reference electrode 320. In some embodiments, reference electrode 320, source electrode 140, and drain electrode 145 are optional. In some embodiments, device 300 comprises an optional light source 330 for illuminating thin conductive layer 115, as discussed below. Device 300 includes a similar configuration to the configuration of device 100 described above and shown in FIG. 1. For example, in this form of the invention, thin conductive layer 115 and buried gate electrode 125 are not in direct electrical contact and are separated by intermediate material layer 120; test solution 110 is in direct contact with both thin conductive layer 115 and liquid gate electrode 130; and liquid gate electrode 130 and thin conductive layer 115 are not in direct contact with one another.

Device 300 can be provided in the form of a chemFET-type device, an electrochemical-FET-type (EChemFET), or an electrochemical-type device. In some embodiments, for electrochemical type devices (or cells), only a single contact to thin conductive layer 115 is needed. Alternatively, in some embodiments, for a chemFET type and related devices, at least two contacts to thin conductive layer 115 are generally needed. Liquid gate electrode 130 is referred to as a "gating electrode" for a chemFET and/or as a "counter electrode" for an electrochemical cell. In some embodiments, liquid gate electrode 130 is a platinum foil for an electrochemical cell. Similar to liquid gate electrode 130, reference electrode 320 is in contact with test solution 110. In some embodiments, reference electrode 320 is a silver-silver chloride electrode. Examples of using device 300 as a chemFET-type device, an electrochemical-FET-type, and an electrochemical-type device are discussed in turn below.

Device 300 Configured As A chemFET-Type Device

In some embodiments, when device 300 is configured as a chemFET-type device, electrons are conducted through thin conductive layer 115 (i.e., an active thin conductive layer 115). The electrical transport properties of thin conductive layer 115 are modulated by the local chemical environment and by an electrical potential applied between thin conductive layer 115 and liquid gate electrode 130, which electrical potential is transmitted through test solution 110. The dynamics of the chemFET-type device are modulated by applying an additional potential to buried gate electrode 125. The potential applied to buried gate electrode 125 relative to thin conductive layer 115 and liquid gate electrode 130 typically alters the dynamics of the electrical transport process by means of one or more of at least three mechanisms, as described in more detail below.

Pursuant to the first mechanism, buried gate electrode 125 "emits" an electrostatic field that is not completely screened by thin conductive layer 115 such that the emitted electrostatic field partially "bleeds through" thin conductive layer 115 and into test solution 110. In a preferred embodiment, at least 1% of the electric field generated by a gate electrode will "bleed through" thin conductive layer 115 so as to interact with the opposite gate electrode (i.e., liquid gate electrode 130) for some range of voltages that may be applied to device 300. Commonly, the amount of field which "bleeds through" thin conductive layer 115 will depend upon the filling of available states within thin conductive layer

115 which is often a function of applied potential and will therefore depend upon the potentials applied between buried gate electrode 125, thin conductive layer 115 and liquid gate electrode 130. The electrostatic field that partially bleeds through thin conductive layer 115 changes the distribution of charges within test solution 110 (e.g., a build-up of Debye layers). It is particularly notable that Debye layer induced screening is a common problem for chemFET sensing in various circumstances and especially for circumstances where test solution 110 has substantial electrical conductivity and/or an analyte is located at a finite distance away from the surface of thin conductive layer 115. The embodiments (for chemFET-type embodiments) of the present invention disclosed herein overcome the common problem for chemFET sensing through modulation of buried gate electrode 125 (e.g., by applying an additional potential to the buried gate electrode 125).

Pursuant to the second mechanism, the potential difference between buried gate electrode 125 and the active thin conductive layer 115 can alter the Fermi level for the active thin conductive layer 115 (similar to the way in which liquid gate electrode 130, or a counter electrode in contact with liquid test solution 110, can also act to modulate the Fermi level in the active thin conductive layer 115). The modulation of the Fermi level alters the population and band position of available charge carriers to conduct electrical current within the active thin conductive layer 115 and thereby modulate the dynamics of the sensing process. It is notable that many embodiments of the device such as illustrated in device 300 decouples these two effects (i.e., the modulation of the Debye layer and the Fermi level). This enables device 300 (and other embodiments described herein) to function in ways that are not possible for traditional device architectures. In particular, device 300 (and other embodiments described herein) allow for improved accuracy and efficiency in processing test solution 110. Stated another way, if desired, an electrical signal may be applied via buried gate electrode 125 in order to modulate the electrical characteristics within the graphene channel provided by thin conductive layer 115, whereby to permit control of sensor function.

Pursuant to the third mechanism, the combination of local electric fields and Fermi level occupation alter the interaction of chemical species with the surface of the local active thin conductive layer 115, e.g., through modulation of effects relating to charge polarization, van der Waals, and London forces, etc. This can modulate processes, such as adsorption to the surface, and modulate local chemical processes, such as providing catalytic influence for de-esterification processes.

Operation of device 300 as a chemFET-type device is controlled by a balance of the electrical potential applied to the FET active thin conductive layer 115 and interaction with the local chemical environment, as well as by the electrical potential applied to the FET active thin conductive layer 115. In some embodiments, the electrical potential is applied to the FET through a liquid gate electrode 130 in contact with test solution 110, and the electrical potential "flows" through test solution 110. In some embodiments, the electrical potential is applied through buried gate electrode 125 (which is not in direct electrical contact with liquid gate electrode 130 or thin conductive layer 115). The chemFET-type device of the present invention is able to use a combination of an electrical potential applied via liquid gate electrode 130 and buried gate electrode 125. This combination modulates electronic properties in the active thin conductive layer 115 (e.g. Fermi level, scattering dynamics, etc.), which affects transduction of information about the chemical environment into an electronic signal and thereby enables additional capabilities for obtaining information about the chemical environment. The electrical potential at the surface (such as that applied by liquid gate electrode 130) intrinsically creates a Debye layer at the surface of the active thin conductive layer 115. This can create a limitation in the operational behaviors available to the device, as certain parameters are conjoined and cannot be independently addressed. Furthermore, the presence of Debye layers in solution can create a screening effect that reduces the ability to sense at longer distances, which often presents a difficulty in systems, such as biological systems, where the Debye length is relatively small and the molecules of interest are often relatively large and spaced at a finite distance from the surface of the active thin conductive layer 115.

Device 300 Configured As An Electrochemical-FET-Type Device

In some embodiments, when device 300 is configured as an electrochemical-FET-type device, electrons are conducted through active thin conductive layer 115 in contact with test solution 110 and/or are exchanged with test solution 110 (Faradaic charge transport). The electrical transport properties of the active thin conductive layer 115 can be modulated by the local chemical environment (including the effects of electron transport processes to the local environment) and by an electrical potential applied between the active thin conductive layer 115 and liquid gate electrode 130 (or counter electrode), and transmitted through test solution 110. In some embodiments, the dynamics of this transistor function can be modulated by applying an additional potential to buried gate electrode 125. The potential applied to buried gate electrode 125 relative to thin conductive layer 115 and liquid gate electrode 130 can alter the dynamics of the electrical transport process by means of typically one or more of at least four mechanisms, as explained in more detail below.

The first, second and third mechanism are similar to the mechanisms described above with respect to device 300 configured as a chemFET-type device.

The Fourth mechanism includes how the modulation of the local electric field, Fermi level, and dispersion forces lead to modulation of the charge transfer between the active thin conductive layer 115 and test solution 110 (Faradaic current) which, in turn, can further modulate the transconductance within the active thin conductive layer 115. This is particularly true for embodiments where redox-active species are located near the surface of the active thin conductive layer 115, such as when redox active species are bound in proximity to the active thin conductive layer 115. Modulation of the structure of the charge double layer may be used to induce alterations to dynamics of the Faradaic current: alterations to the Frumkin correction and alterations to the Levich exclusion effect. In the Frumkin effect, the finite thickness of the charge double layer and the relative positions of the inner- and outer-Helmholtz planes and the electric potential at these positions influences the dynamics of charge transfer between species in test solution 110 and thin conductive layer 115 so that as the structure and gradient of the charge double layer is altered so too are the dynamics of the charge transfer process. In the Levich exclusion effect, the local electric field acts to attract or repel charged species from the active electrode (i.e., thin conductive layer 115), leading to local alterations to concentrations and distributions thereof, and thus altering the charge transfer process dynamics between these species and the active electrode. Thus, it will be appreciated that an electrical signal may be applied to one or more of buried gate electrode 125, the graphene channel provided by thin conductive layer 115 and/or liquid gate electrode 130 after introduction of test solution 110, whereby to result in a sweeping charge carrier population in the graphene channel of thin conductive layer 115 while maintaining a charge double layer at an interface between the graphene channel and the liquid sample and/or the application of the electrical signal may modulate interfacial charge distributions.

Operation of device 300 as an electrochemical-chemFET-type device is controlled by a balance of the potential applied to the FET active thin conductive layer 115 by interaction with the local chemical environment; by the electrical potential applied to the FET active thin conductive layer 115 relative to the other electrodes; and by chemistries and fields that result from electron transport between the active thin conductive layer 115 (and liquid gate electrode 130) and test solution 110. In some embodiments, the electrical potential is applied to the FET through the liquid gate electrode 130 in contact with test solution 110 and the electrical potential "flows" through test solution 110. For instance, in some embodiments a redox-active species may be bound to the vicinity of the surface of the active thin conductive layer 115 and an electrical potential applied between the active thin conductive layer 115 and liquid gate electrode 130 can lead to an alteration in the charge state of the redox-active species and thereby apply an additional local potential on the active thin conductive layer 115. This effect can modulate the electronic properties in the active thin conductive layer 115 (e.g., Fermi level, scattering dynamics, etc.), which provides transduction of information about the chemical environment into an electronic signal. In this form of the invention, electrical potential at the surface (such as that applied by liquid gate electrode 130) intrinsically creates a Debye layer at the surface of the active thin conductive layer 115. This can create a limitation in the operational behaviors available to electrochemical-chemFET-type devices. Additionally, the linked proportionality of Debye layer and the Fermi level of the active thin conductive layer 115 can constrain the dynamics of the electrochemical processes which proceed in this configuration. Furthermore, the presence of Debye layers in test solution 110 can create a screening effect, which can reduce the ability to sense at longer distances, which often presents a difficulty in systems, such as biological systems, where the Debye length is relatively small and the molecules of interest are often relatively large and spaced at a finite distance from the surface of the active thin conductive layer 115. The interrelationship of these constraints can be modulated by the application of potential to buried gate electrode 125 which can thus provide additional operational freedom and functionality to the device.

Also, if desired, in some alternative embodiments, redox species may be provided within test solution 110 to provide an electrochemical process between the active thin conductive layer 115 and another electrode in contact with the test solution 110 (e.g., liquid gate electrode 130) in which said electrochemical process interacts with the chemFET operation. In some embodiments, said non-bound redox species may be chosen to have a known redox potential and thereby provide an electrochemical referencing effect to the transconductance operation of the active thin conductive layer 115. In some embodiments, the non-bound redox species may be an analyte being tested or a reporter species on an analyte being tested. With this form of the invention, the applied redox potential is decoupled from the charge double layer, and/or the applied redox potential is decoupled from the charge carrier population.

Device 300 Configured As An Electrochemical-Type Device

In some embodiments, when device 300 is configured as an electrochemical-type device, electrons are transferred between thin conductive layer 115 and liquid gate electrode 130 (or counter electrode) through intervening test solution 110 by means of an electrochemical process. The dynamics of this electrochemical process are modulated by applying an additional potential to buried gate electrode 125. The additional potential applied to buried gate electrode 125 relative to thin conductive layer 115 and liquid gate electrode 130 alters the dynamics of the electrochemical process, typically by means of one or more of at least three mechanisms, as explained in more detail below. In some alternative embodiments of an electrochemical device, one or more of the electrodes in physical contact with test solution 110 will not exchange electrons with test solution 110, but will drive current through capacitive re-distribution of charges to the surface of the electrodes to create "displacement currents" which are transient in time for the operation of device 300. Such operational processes are most commonly used in conjunction with high surface area electrodes. For example, in some embodiments, liquid gate electrode 130 may be constructed as a high surface area electrolytic capacitor electrode and time-transient currents may be applied between liquid gate electrode 130 and thin conductive layer 115.

In the first mechanism, buried gate electrode 125 emits an electrostatic field that is not completely screened by thin conductive layer 115. The electrostatic field emitted by buried gate electrode 125 partially bleeds through into test solution 110 and changes the distribution, arrangement, and orientation of charged (and uncharged) species within test solution 110 (e.g. the build-up of Debye layers). The local electric field and disposition of charges contribute to the dynamics of charge transfer processes. In particular, modulation of the structure of the charge double layer may be used to induce alterations to dynamics of the Faradaic current: alterations to the Frumkin correction and alterations to the Levich exclusion effect. In the Frumkin effect, the finite thickness of the charge double layer and the relative positions of the inner- and outer-Helmholtz planes and the electric potential at these positions influences the dynamics of charge transfer between species in test solution 110 and thin conductive layer 115 so that, as the structure and gradient of the charge double layer is altered, so too are the dynamics of the charge transfer process. In the Levich exclusion effect, the local electric field acts to attract or repel charged species from the active electrode (i.e., thin conductive layer 115), leading to local alterations to concentrations and distributions thereof, and thus altering the charge transfer process dynamics between these species and the active electrode. Thus, it will be appreciated that application of an electrical signal to one or more of buried gate electrode 125, the graphene channel provided by thin conductive layer 115 and/or liquid gate electrode 130 after introduction of test solution 110 may result in disruption of, or even elimination of, the charge double layer at an interface between the graphene channel and the liquid sample.

In the second mechanism, the potential difference between buried gate electrode 125 and thin conductive layer 115 alter the Fermi level for thin conductive layer 115. This, in turn, alters the available charge carriers to carry out electrochemical reactions with test solution 110 and the dynamics of their transfer between test solution 110 and thin conductive layer 115. It should be noted that the "thinner" thin conductive layer 115 is, the larger impact. Thinness of thin conductive layer 115 is described above in reference to FIG. 1. The physical thickness of this layer can create an additional impact on the functioning of this structure in that thicker physical layers can enable more charge carriers within the "bulk" of the layer and away from the surface of thin conductive layer 115 where charges within the layer are free to interact and exchange with test solution 110. Furthermore, thicker physical layers will enable non-negligible differences between the electrical potential at the "top" of the layer in contact with test solution 110 and the electrical potential at the "bottom" of the layer facing buried gate electrode 125. FIG. 2 illustrates the mathematical idealization of a device (e.g., device 100) in which this physical thickness can be considered infinitesimal and such potential differences between the "top" and "bottom" surfaces can be neglected.

Pursuant to the third mechanism, the combination of local electric fields and Fermi level occupation alter the interaction of chemical species with the local active thin conductive layer 115 surface, e.g., through modulation of effects relating to charge polarization, van der Waals, and London forces, etc. This can modulate processes, such as adsorption to the surface, and modulate local chemical processes (including non-Faradaic processes), such as providing catalytic influence for de-esterification processes, wetting and de-wetting, etc.

Operation of the electrochemical systems and the electrochemical processes disclosed herein is controlled by the potential difference maintained between two or more electrodes in electrical contact with test solution 110 (e.g., thin conductive layer 115 and/or liquid gate electrode 130), which electrical contact acts in conjunction with effects from the surface chemistry, electrical characteristics of these electrodes, and the chemical properties of test solution 110 to determine the charge flow through the electrolyte material and the corollary chemical reactions which are promulgated. These factors can thus act to determine the dynamics of the electrochemical process in the cell, but the proportional connection between the Fermi level in the electrode, as well as the Debye layer and dispersion forces at the electrode, can constrain the dynamics of the system and process. This behavior can be modified by using an additional electrode (e.g., buried gate electrode 125) which is in electrostatic contact with the other electrodes (e.g., thin conductive layer 115 and/or liquid gate electrode 130) and test solution 110 within the cell, but not itself in direct electrical contact with these other electrodes or test solution 110, especially in a "buried" configuration below the active, "working" electrode with limited quantum capacitance (e.g., thin conductive layer 115). Due to "bleed through" of the electric field and additional modulation of the Fermi level, such a configuration alters the dynamics of electrical transport between thin conductive layer 115 and test solution 110, thereby altering the electrochemical dynamics.

As illustrated above, device 300 can be configured as a chemFET-type device, an electrochemical-FET-type, and an electrochemical-type device and used for a variety of applications. Such applications include, but are not limited to, chemical sensing using chemFET, electrochemical FET, or electrochemical sensing. Such applications also include electrochemical synthesis (e.g. electro-reductive methanol synthesis), fuel cells (e.g. oxygen reduction reaction), capacitive energy storage, capacitive desalination, etc.

Returning to FIG. 3, in various embodiments according to the present disclosure, the relationship of relative voltages between the various electrodes take on various forms according to the desired outcome and dynamics for operation of device 300. In a basic form, the electronic structure of the device can be considered as three circuits possessing intrinsic capacitance joining together at a central node, as described above in reference to FIG. 2. The potential on the central node ("VChannel") can represent the potential of electrons within the active thin conductive layer 115 (the Fermi level), taking into account both applied electrical potentials, as well as chemical and "quantum" (density-of-states) contributions and the voltage/potential dropped across the interface between active thin conductive layer 115 and the liquid of test solution 110 (these can be represented, e.g., by the voltage drop across CT215 in FIG. 2). Each of the illustrated circuit elements in FIG. 2 represents an idealization, which can be more complex for construction into a physical device, including resistances, parasitic capacitances, and the like. For example, CT 215 in FIG. 2 can be composed of at least two capacitances in series, wherein one capacitance is formed between the active conductive layer 115 and test solution 110 and the other can be formed between liquid gate electrode 130 and test solution 110. As such, for certain cases, it can be advantageous to further incorporate such elements into the model and account for the potential drop across each liquid interface separately. By analysis of the circuit of FIG. 2 and, in particular, the voltage dropped across CT 215, it can be possible to model the formation of electric field bleed through with accompanying charge double layer formation. In general, it can be necessary to take into account the particular density-of-states (DOS) band structure of the active thin conductive layer 115 (and potentially other electrodes) and also the relative resistance and capacitance of test solution 110 (especially for non-zero frequencies) and it can be necessary to measure these experimentally.

By taking into account the structure of the density-of-states of the active thin conductive layer 115 and the capacitance structure of test solution 110 and buried gate electrodes 125 relative to the active thin conductive layer 115 and through the active thin conductive layer 115, it can be possible to select voltage levels to apply to the system to modulate the parameters of the system and achieve outcomes desirable for particular operational states. For instance, voltages can be applied to liquid gate electrode 130 (or counter electrode), buried gate electrodes 125, and active thin conductive layer 115 such that the net electrical field between the active thin conductive layer 115 and test solution 110 is zero and Debye layer formation is suppressed for any chosen Fermi level of the active thin conductive layer 115. This can be advantageous to operational modalities, such as chemFET-type operation wherein the Debye layer acts to screen the effect of local charges on the active thin conductive layer 115 and thus reduce the sensing outcome. In some embodiments, a constant voltage component may be applied to buried gate electrode 125 to shift the Dirac point observed for the graphene channel of thin conductive layer 115 to be at a particular voltage versus liquid gate electrode 130. In some cases, a constant voltage component may be applied to buried gate electrode 125 to shift the Dirac point observed for the graphene channel of thin conductive layer 115 to be at zero volts applied between the graphene channel of thin conductive layer 115 and liquid gate electrode 130.

For instance, more generally, voltages can be applied to liquid gate electrode 130 (or counter electrode), buried gate electrodes 125, and the active thin conductive layer 115 such that, for a given Fermi level, the Debye layer strength can be any of enhanced, reduced, eliminated, or reversed in direction from the Debye layer that would be formed for an equivalent Fermi level filling of the active thin conductive layer 115 achieved only by application of potential between the active thin conductive layer 115 and liquid gate electrode 130 (e.g., as would be achieved using conventional architecture). It is of note that the application of a particular waveform from buried gate electrodes 125 often cannot produce a bleed-through field of this same waveform due to the non-constant value of the quantum capacitance with respect to applied voltage that is common for many relevant materials, such as graphene. This can provide a mechanism to alter various dynamics of the device for various different applications, such as electrochemical applications wherein the Debye layer affects both the kinetics of electron transport between the active thin conductive layer 115 and species in test solution 110, and also affects the distribution of charged and uncharged species within test solution 110. In some embodiments, the voltage applied between the various electrodes can be non-static in time and, in some embodiments, can take the form of waveforms that oscillate in time. Such correlated potential waveforms can be chosen to satisfy a variety of criteria, examples of which are provided below.

In one embodiment, oscillating potentials can be utilized that create an oscillating electric field at the interface between active thin conductive layer 115 and test solution 110 while keeping the Fermi potential static. Specifically, the applied voltage of both liquid gate electrode 130 (or counter electrode) and buried gate electrodes 125 relative to the active thin conductive layer 115 can both oscillate in time at the same frequency and optionally the same phase, and can be balanced with respect to their capacitive coupling to the active thin conductive layer 115 so as to maintain a constant Fermi potential for charge carriers within the active thin conductive layer 115 while creating an oscillating electric field at the interface of the active thin conductive layer 115 and test solution 110. In some embodiments, the time oscillating component of the applied potential may be applied by only liquid gate electrode 130 or buried gate electrode 125. This, in turn, can create a time oscillating modulation to the Debye layer, driving local electroosmotic currents at suitable frequencies that can weaken the screening and increase the effective length of the Debye layer. At lower frequencies, this can also lead to other effects which can moderate both electrochemical and non-electrochemical processes, such as non-Faradaic catalysis. Furthermore, the fixed Fermi level value can act to stabilize the electrical characteristics of the active thin conductive layer 115 on a transconductance curve aside from environmental influence so that variations in the electrical properties can be more directly measured. Variations in electrical properties with a frequency tied to the oscillation frequency (e.g., harmonic generation) can be particularly effective in reporting environmental information and can be less prone to various types of sensor drift or noise since it can be measured in frequency space.

In some embodiments, oscillating potentials are utilized that simultaneously provide high frequency disruption to the Debye layer while minimizing DC (direct current) Debye layer formation. Specifically, the applied voltage of both liquid gate electrode 130 (counter electrode) and buried gate electrodes 125 relative to the active thin conductive layer 115 can both oscillate in time at the same frequency with correlated phase and can be balanced with respect to their capacitive coupling to the active thin conductive layer 115 bleed through so as to both minimize (and commonly eliminate) the DC component of the electric field and corresponding Debye layer at the interface between the active thin conductive layer 115 and test solution 110, as well as provide an oscillating AC (alternating current) field to modulate and often disrupt the formation of Debye layers within test solution 110, both directly at the surface of active thin conductive layer 115 and, more generally, throughout test solution 110. The oscillating potentials from the applied voltage can provide conditions to maximally reduce screening of charges within test solution 110 from the active thin conductive layer 115 and thereby maximize the ability of the active thin conductive layer 115 to sense chemical species within test solution 110, even when these species are spaced at a finite distance from the active thin conductive layer 115.

In some embodiments, oscillating potentials can be utilized that create an oscillating Fermi level within the active thin conductive layer 115 while suppressing the oscillation of the net electric field to maintain a more static or quasi-static electric field at the interface between active thin conductive layer 115 and test solution 110 (and resulting Debye layer). Specifically, the applied voltage of both liquid gate electrode 130 (or counter electrode) and buried gate electrode 125 relative to the active thin conductive layer 115 can both oscillate in time at the same frequency with correlated phase, and can be balanced with respect to their capacitive coupling to the active thin conductive layer 115 and bleed through in such a way so that the Fermi level is maintained at a constant value while the value of the electric field and corresponding Debye layer at the interface of active thin conductive layer 115 and the liquid of test solution 110 oscillates in time. This modality can allow for the implementation of various electrochemical and/or electrical processes, such as frequency doubling around the Dirac point while maintaining fixed or reduced Debye layer characteristics.

In some embodiments, oscillating potentials can be applied as three-phase voltage and/or current waveforms to the three leads of the device (e.g., thin conductive layer 115, buried gate electrode 125, and liquid gate electrode 130). Specifically, voltages or currents can be applied to the active thin conductive layer 115, liquid gate electrode 130 (or counter electrode), and buried gate electrode 125 relative to each other in a three-phase configuration such that these applied electrical inputs are maintained at the same frequency but phase shifted from each other by 120°.

In some embodiments, non-time-static potentials can take the form of various swept potentials for use with chemFET and electrochemical designs used in conjunction with additional modulation applied by buried gate electrode 125. Such swept potentials can be used in chemFET devices to measure transconductance. Such swept potentials can be used in various electrochemical measurements, including cyclic voltammetry, square wave voltammetry, linear sweep voltammetry, and the like. In such cases, buried gate electrode 125 can be applied in various ways, such as being held at a steady applied voltage or being swept in conjunction with liquid gate electrode 130 (or counter electrode) to achieve particular modulations to the active thin conductive layer 115 process, such as directly modulating Fermi level and Debye layer formation as decoupled parameters and thus enabling the measurement of more rich information about the electrochemical processes occurring than is possible with traditional device designs.

Various other modalities are also possible, including combinations of those enumerated above. Furthermore, devices constructed according to the present disclosure can be used in a various modalities for a particular measurement operation.

Figure 10:
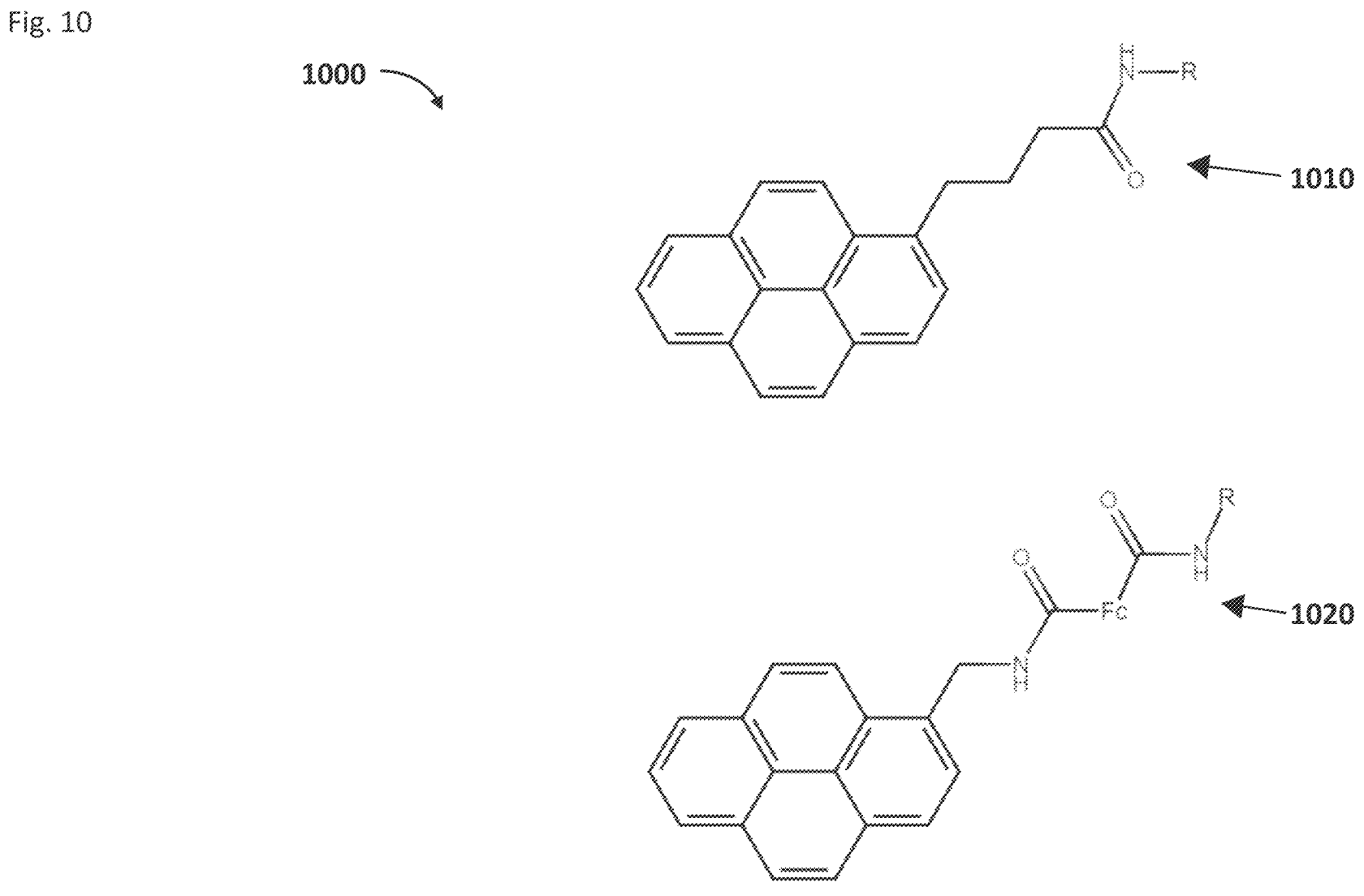

As a first example, in some embodiments, device 300 improves the performance of a chemFET-type device. In particular, when device 300 is configured as a chemFET-type, device 300 enhances the performance of chemFET detection of an analyte in a condensed test solution 110. In some embodiments, the active thin conductive layer 115 is constructed as a monolayer graphene sheet supported atop intermediate material layer 120 (e.g., a layer of silicon oxide) over buried gate electrode 125 (e.g., a heavily doped silicon layer). Intermediate material layer 120 separates buried gate electrode 125 from thin conductive layer 115, thereby preventing direct electrical contact between buried gate electrode 125 and thin conductive layer 115. A test solution 110 (e.g., an aqueous electrolyte solution) is in contact with (i) the active thin conductive layer 115 from "above" (e.g., on top of at least a surface of thin conductive layer 115), and (ii) an inert electrode (e.g., liquid gate electrode 130 which can be formed from materials such as gold, platinum, boron-doped diamond, etc.). A concentration of sensitizer molecules can be coupled to thin conductive layer 115. Linker molecules such as molecules 1010 and 1020 illustrated in 1000 of FIG. 10 may be used to couple the sensitizer molecules to the surface of some types of thin conductive layers via non-covalent interactions such as molecular pi-pi stacking. In the molecules illustrated at 1010 and 1020, 'R' stands for the sensitizer molecule. In some embodiments, said sensitizer molecules may be antibodies. Thin conductive layer 115 can carry out sensing of the corresponding antigen by a chemFET sensing modality by sweeping the Fermi level in the active thin conductive layer 115 from approximately ±0.7V versus the Dirac point and measuring the transconductance properties of the device, such as the position of the Dirac point versus the applied voltage between the active thin conductive layer 115 and liquid gate electrode 130 (or counter electrode). In this example, voltage can be dynamically applied to buried gate electrode 125 and to liquid gate electrode 130 relative to the active thin conductive layer 115 such that these potentials are balanced to minimize the formation of the DC Debye layer while having a high frequency component wherein the frequencies of the two applied voltage signals are matched and wherein the bleed through field from this high-frequency oscillating component reinforces the amplitude of the local oscillating electric field to maximize the AC Debye layer disruption effect. This can enable the chemFET to be maximally sensitive to antigen binding to the antibody which is anchored to the active thin conductive layer 115 surface even when the antigen is at a finite distance away from the surface of the active thin conductive layer 115.

As a second example, in some embodiments, device 300 improves the performance of a chemFET-type device. In particular, when device 300 is configured as a chemFET-type device, device 300 enhances the performance of chemFET detection of an analyte in a condensed test solution 110. In some embodiments, the active thin conductive layer 115 is constructed as a monolayer graphene sheet supported atop intermediate material layer 120 (e.g., a layer of hafnium oxide) over buried gate electrode 125 (e.g., a copper substrate). Intermediate material layer 120 separates buried gate electrode 125 from thin conductive layer 115, thereby preventing direct electrical contact between buried gate electrode 125 and thin conductive layer 115. A test solution 110

(e.g., an aqueous electrolyte solution) is in contact with the active thin conductive layer 115 from "above" (e.g., on top of at least a surface of thin conductive layer 115) and further in contact with a reference electrode 320 (e.g., Ag|AgCl) and liquid gate electrode 130 (e.g., gold, platinum, boron-doped diamond, etc.) that serves as a counter electrode. A concentration of valinomycin can be coupled to thin conductive layer 115 (e.g., by direct physisorption) and thin conductive layer 115 can carry out sensing of the potassium ion concentration by a chemFET sensing modality by sweeping the Fermi level in the active thin conductive layer 115 from approximately ±0.7V versus the Dirac point and measuring the transconductance properties of the device, such as the position of the Dirac point versus the applied voltage between the active thin conductive layer 115 and the counter electrode (i.e., liquid gate electrode 130). In this example, a plurality of transconductance sweeps versus liquid gate electrode 130 (or counter electrode) are made during which a plurality of buried gate electrode 125 voltage levels are applied. The voltage from buried gate electrode 125 is dynamically applied to buried gate electrode 125 and to the counter electrode (i.e., liquid gate electrode 130) relative to the active thin conductive layer 115 such that some of the potentials from buried gate electrode 125 are balanced to minimize the formation of the DC Debye while other voltages from buried gate electrode 125 are applied to enhance the formation of the DC Debye layer so that the influence distance from the surface can be ascertained for various sensor signal contributions. This can enable the chemFET device to provide additional information relating to where species are in terms of distance to the surface of thin conductive layer 115.

As a third example, in some embodiments, device 300 improves the performance of an electrochemical-FET device. In particular, when device 300 is configured as a electrochemical-FET-type device, device 300 enhances the performance of electrochemical-FET detection of an analyte in a condensed test solution 110. The active thin conductive layer 115 can be constructed as a monolayer graphene sheet supported atop a layer of intermediate material layer 120 (e.g., a layer of silicon oxide) over buried gate electrode 125 (e.g., a heavily doped silicon layer). Intermediate material layer 120 separates buried gate electrode 125 from thin conductive layer 115, thereby preventing direct electrical contact between buried gate electrode 125 and thin conductive layer 115. A test solution 110 (e.g., an aqueous electrolyte solution) is in contact with the active thin conductive layer 115 from "above" (e.g., on top of at least a surface of thin conductive layer 115) and further in contact with an inert electrode (e.g the liquid gate electrode 130 which can be formed from materials such as gold, platinum, boron-doped diamond, etc.). A concentration of pyrenemethylamide-ferrocene-dicarboxylate-antibody 1020 (FIG. 10) can be coupled to thin conductive layer 115 (e.g., bonded by pi-stacking of the pyrene moiety to the graphene which tethers the antibody to the graphene surface). This may be carried out via various methods including pre-conjugated pyrenic-ferrocenic-antibody molecules that are deposited from solution or via in-situ assembly of pyrenemethylamide-ferrocene-dicarboxylate-antibody 1020 by assembly of pyrenemethylamide on the graphene surface followed by 1:1 conjugation of the pyrene-amine to ferrocenedi(carboxylate-NHS ester) followed by conjugation to the antibody via amide formation of the other-wise free carboxylic acid NHS ester group on the ferrocene dicarboxylate moiety. In some embodiments, thin conductive layer 115 can carry out sensing of antibody state and correlated antigen concentration by a chemFET sensing modality by sweeping the Fermi level in the active thin conductive layer 115 from approximately ±0.9V between thin conductive layer 115 potential and the counter electrode (e.g., liquid gate electrode 130) and measuring the transconductance properties of the device, such as the position of the Dirac point versus the applied voltage between the active thin conductive layer 115 and the counter electrode (i.e., liquid gate electrode 130). In this example, a plurality of transconductance sweeps versus liquid gate electrode 130 can be made during which a plurality of buried gate electrode 125 voltage levels can be applied wherein buried gate electrode 125 voltage is dynamically applied to buried gate electrode 125 and to the counter electrode (liquid gate electrode 130) relative to the active thin conductive layer 115 such that some of the potentials from buried gate electrode 125 decrease the necessary voltage for the ferrocene to undergo redox, while others of the potentials from buried gate electrode 125 increase the necessary voltage for the ferrocene to undergo redox. This can provide a transconductance curve which also incorporates referencing information from the ferrocene redox events and contains information regarding the chemical environment of the ferrocene, including molecules that the ferrocene is bound to that can be used to provide additional information for sensing and signal stabilization for the chemFET signal output.

In some embodiments comprising redox-active species bound to the surface of thin conductive layer 115, a multiplicity of redox-active species may be bound to the surface of thin conductive layer 115. The different redox species are differentially coupled to analyte species such as antibodies and thereby provide enhanced stabilization and specificity in the device read-out. For instance, a concentration of pyrenemethylamide-ferrocene-dicarboxylate-antibody-amide 1020 (where "R" represents the antibody which is bonded by pi-stacking of the pyrene moiety at the graphene that tethers the antibody to the graphene surface of thin conductive layer 115) and pyrenebutyrate-amidoferrocene 1010 (where "R" in this case represents a ferrocene) can be disposed on thin conductive layer 115. In some embodiments "R" may further represent a ferrocene with an additional moiety attached such as a polyethylene glycol chain to provide surface passivation effects for non-specific interactions. This provides two different redox-active species with differentiated redox potentials for each and wherein these two types of redox species shows a differential sensitivity to the state of the antibody. Thin conductive layer 115 can carry out sensing of antibody state and correlated antigen concentration by a chemFET sensing modality by sweeping the Fermi level in the active thin conductive layer 115 from approximately ±0.9V between the potential of thin conductive layer 115 and the counter electrode (i.e., liquid gate electrode 130) and measuring the transconductance properties of the device, such as the position of the Dirac point versus the applied voltage between the active thin conductive layer 115 and the counter electrode (i.e., liquid gate electrode 130). In this example, a plurality of transconductance sweeps versus liquid gate electrode 130 (or counter electrode) can be made during which a plurality of buried gate electrode 125 voltage levels can be applied, wherein buried gate electrode 125 voltage is dynamically applied to buried gate electrode 125 and to liquid counter electrode 130 relative to the active thin conductive layer 115 such that some of the potentials from buried gate electrode 125 decrease the necessary voltage for the ferrocenes to undergo redox, while other potentials of buried gate electrode 125 increase the necessary voltage for the ferrocenes to undergo redox. This can provide a transconductance curve which also incorporates referencing information from the ferrocene redox events and contains information regarding the chemical environment of the ferrocene including molecules that the ferrocene is bound to that can be used to provide additional information for sensing and signal stabilization for the chemFET signal output.

As a fourth example, in some embodiments, device 300 is used to enhance the electrochemical process dynamics of increasing the charge state of ionic species (e.g., oxidation of metal cations to higher oxidation states such as $Fe2+{\rightarrow}Fe3+$, etc.). For a traditional electrochemical cell reaction, the ionic species must first diffuse "uphill" against a Debye layer potential and then the electrode must then exchange one or more electrons with the ion. This is typically achieved simply by applying a suitable amount of potential between thin conductive layer 115 and liquid gate electrodes 130 (counter electrodes). Device 300 further enables an additional potential to be applied to buried gate electrode 125, which acts to at least partially "offset" the potential applied to thin conductive layer 115. For instance, if thin conductive layer 115 is positive in order to drive oxidation, then a negative potential could be applied the buried gate electrode 125. This offsetting potential can create an electrostatic field that bleeds through thin conductive layer 115 and into test solution 110 (e.g., an electrolyte solution) and is opposite in sign to the electric field generated by the potential on thin conductive layer 115. This can act to reduce the Debye charging layer which accumulates at the surface of thin conductive layer 115, and thus reduces the energetic penalty accrued by the ion to diffuse to the charged contacting electrode (e.g., thin conductive layer 115) and thus alter the dynamics of the electrochemical reaction process. Simultaneously, the application of a potential to buried gate electrode 125 can also act to electrostatically modify the concentration and type of charge carriers within the contacting electrode (e.g., thin conductive layer 115) (carrier 'doping'). In the case where the potential is "offsetting" versus the potential applied to thin conductive layer 115, this potential can act to increase the appropriate charge carrier concentration to enhance suitable electron transfer.

As a fifth example, in some embodiments, device 300 is used to suppress certain electrochemical process dynamics of reducing the charge state of ionic species (e.g., reduction of metal cations to lower oxidation states such as $Fe3+{\rightarrow}Fe2+$, etc.). In a traditional electrochemical cell reaction, the ionic species will first diffuse energetically "downhill" in a Debye layer potential and then the electrode must then exchange one or more electrons with the ion. This is typically caused by applying a sufficient amount of potential between thin conductive layer 115 and liquid gate electrodes 130 (counter electrodes). Device 300 further enables an additional potential to be applied to buried gate electrode 125, which acts to "supplement" the potential applied to thin conductive layer 115. For instance, if thin conductive layer 115 is positive then a more positive potential could be applied to buried gate electrode 125. This supplementing potential can create an electrostatic field that bleeds through thin conductive layer 115 and into test solution 110 (electrolyte solution), such that the electric field is the same in sign to the electric field generated by the potential on thin conductive layer 115. This can act to increase the Debye charging layer which accumulates at the surface of thin conductive layer 115 and simultaneously this application of a potential to buried gate electrode 125 can also act to electrostatically modify the concentration and type of charge carriers within thin conductive layer 115. In the case where the potential is "supplementing" versus the potential applied to thin conductive layer 115, this potential can act to decrease the charge carrier concentration in such a way as to suppress electron transfer (that is, for the graphene of thin conductive layer 115, the potential will act to move the Fermi level back toward the Dirac point). This can be used to suppress electron transfer in systems where this is undesirable (e.g. capacitive desalination, electrochemical capacitive energy storage, etc.).

As a sixth example, in some embodiments, device 300 is used to detect and distinguish between various aspects of the electrochemical behavior of test solution 110 (electrolyte solution) environment. In such an embodiment, a particular potential and/or multiple different potentials can be applied to buried gate electrode 125 while one or more electrochemical sensing procedures are conducted (e.g., cyclic voltammetry, amperometry, etc.). By monitoring electrochemical system behavior as differentiated by buried gate electrode 125 applied voltage, additional information regarding system dynamics can be ascertained versus the information that can be determined from equivalent traditional methods that lack such a buried gate electrode 125.

As an eighth example, in some embodiments, the active thin conductive layer 115 is illuminated with a light source 330 during operation to drive light induced processes. The active thin conductive layer 115 can be illuminated with light source 330 during operation to drive light induced processes, including photoconductive, photo-electrochemical, or photochemical processes. These light induced processes can proceed directly by light absorption by the electrode (i.e., thin conductive layer 115) or by light absorption by photo-active species which are proximate to the electrode (i.e., thin conductive layer 115). Such photo-active species can include ferrocene, phthallocyanines, chlorophyllins, pyrenes, perylenes, etc. These species can be located in various positions relative to the active thin conductive layer 115, including bound above thin conductive layer 115, bound to thin conductive layer 115, or bound below thin conductive layer 115.

In some embodiments, active thin conductive layers 115 are made of materials which possess a relatively high kinetic energy per carrier in conducting current, such as graphene or carbon nanotubes. An electrical potential can be applied across the active thin conductive layer 115 via source electrode 140 and drain electrode 145 while also applying a voltage between the active thin conductive layer 115 and liquid gate electrode 130 (or counter electrode) to drive an electrochemical reaction. A voltage can also optionally be applied between the active thin conductive layer 115 and buried gate electrode 125. In such an embodiment, the kinetic energy of the carriers in conducting current through the active thin conductive layer 115 can modify the energy budget for driving the electrochemical reaction of transferring electrons between the active thin conductive layer 115 and the liquid phase test solution 110.

Figure 4:
FIG. 4 is a diagram of a third embodiment of a device according to the present invention.

FIG. 4 illustrates a device 400 for screening a test solution, in accordance with the present invention. Similar to device 100 and device 300, device 400 includes a test solution 110 (also referred to as a test sample), a thin conductive layer 115, one or more electrodes, and an intermediate material layer 120. Like device 300, the one or more electrodes include a buried gate electrode 125, a source electrode 140, a drain electrode 145, a liquid gate electrode 130, and a reference electrode 320. In some embodiments, the reference electrode 320, the source electrode 140, and the drain electrode 145 are optional. Device 300 further includes an additional layer 405 coupled between thin conductive layer 115 and intermediate material layer 120. In some embodiments, the active thin conductive layer 115 is constructed atop, and in contact with, additional layer 405. In some embodiments, additional layer 405 includes a redox active species. In such an embodiment, the redox active species can serve to provide a referencing potential to the system which is in partial contact with test solution 110 due to the bleed through effect.

For example, device 400 can include a thin conductive layer 115 constructed as a monolayer of graphene atop additional layer 405 (which, in some embodiments, is ferrocene of approximately one monolayer thickness), which is supported atop intermediate material layer 120 (e.g., a layer of silicon oxide) and all atop buried gate electrode 125 (e.g., a base of highly doped silicon). Thin conductive layer 115 is advantageously constructed with edges that are "sealed" by a coating of inert metal oxide so that the ferrocene layer (i.e., the additional layer 405) is "sealed" under thin conductive layer 115 and this system is further placed in contact with test solution 110 which is also in contact with one or more liquid gate electrodes 130 (or counter electrodes). The redox state of the ferrocene (of additional layer 405) under the graphene (of thin conductive layer 115) can be determined by the relative values of the potentials applied to the active thin conductive layer 115, buried gate electrode 125 and liquid gate electrode(s) 130, and can provide a referencing function in conjunction with test solution 110. In some embodiments, other electrodes can also or separately be constructed to have such a "buried redox" layer architecture for purposes such as referencing.

Figure 5:
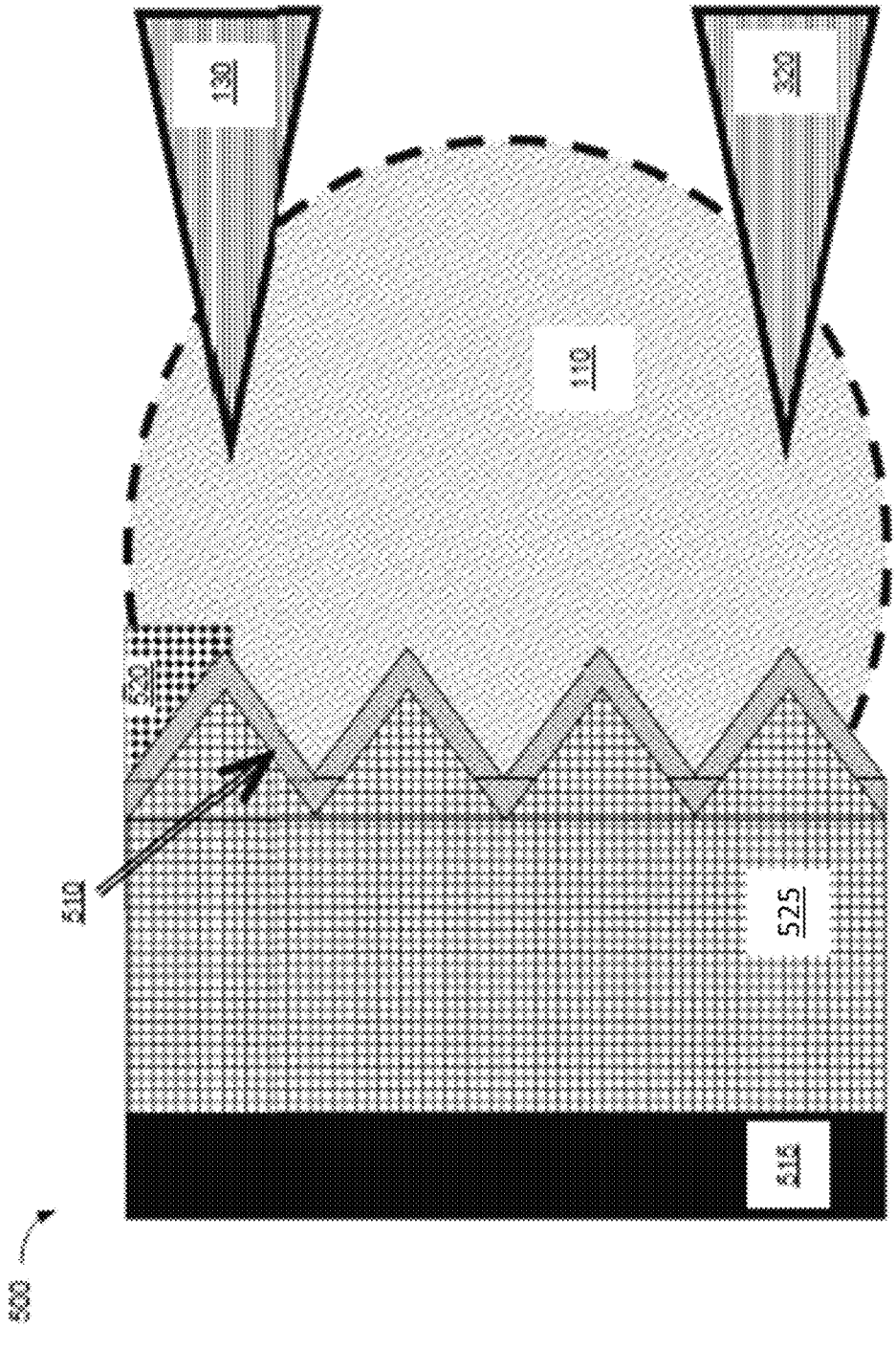
FIG. 5 is a diagram of a fourth embodiment of a device according to the present invention.

FIG. 5 illustrates a device 500 for interacting with a test solution, in accordance with the present invention. Device 500 includes a test solution 110 (also referred to as a test sample), a thin non-planar conductive layer 510, a non-planar supporting substrate 525 which also serves as a buried gate electrode, and one or more electrodes. The one or more electrodes include (i) a buried gate electrode 525 which is constructed so as to be coupled to conductive layer 510 via electric field interaction, but to substantially not directly exchange charge with conductive layer 510, (ii) an electrical contact 520 contacting conductive layer 510, (iii) an electrical contact 515 which is contacting buried gate electrode 525, and (iv) a liquid gate electrode 130. In some embodiments, device 500 also includes a reference electrode 320. Device 500 can include one or more features described above in reference to devices 100, 300, and 400 for screening a test solution. In some embodiments, non-planar supporting substrate 525 may be comprised of a ionic conducting material. In some embodiments, non-planar supporting substrate 525 may be comprised of a conformal insulating layer coating non-planar conductive layer 510 and a conducting conformal material in contact with the conformal insulating layer opposite to the non-planar conductive layer 510.

In some embodiments, buried gate electrode 525 includes a polymeric layer supporting ionic conduction. In some embodiments, thin non-planar conductive layer 510 is constructed to possess a non-planar geometry to increase the electrode surface area. In some embodiments, producing thin non-planar conductive layer 510 includes providing a high surface area catalytic substrate onto which thin non-planar conductive layer 510 (e.g., graphene) is conformally deposited by Chemical Vapor Deposition (CVD) through graphene growth conditions to create thin non-planar conductive layer 510 (i.e., graphene layers). In some embodiments, conditions can be adjusted so as to create substantially monolayer graphene layers. Such conditions can be described as self-limiting and/or nucleation-suppressed growth conditions. In some embodiments, the catalytic substrate may be formed from materials including copper, nickel, or a copper-nickel alloy. In some embodiments, this catalytic substrate can be formed from sintering granular metallic particles and, in some cases, these granular metallic particles can be sintered together atop an underlying metallic substrate at a temperature slightly below the melting point of the metallic composition and thus create a fused metallic body with increased surface area. In some embodiments where copper or nickel is used, metallic particles comprising particles that are substantially terminated by a particular crystallographic plane particulates may be used to improve the growth process of the graphene. In some embodiments, metallic layers can be deposited onto bodies possessing non-planar features in order to create increased surface area substrates for graphene deposition. In some embodiments, metallic deposition substrates possessing increased surface area can be produced by anisotropically etching a pre-existing metallic substrate. In some embodiments where the metallic deposition substrate is formed by etching, the etch can be performed so as to create a surface which is substantially terminated in a preferred crystallographic plane for growth of the conductive material. Once the graphene layer is formed atop the substrate, the graphene encapsulated metallic body can then be cooled and conformally infiltrated with the ionic conducting polymer material which is hardened to form a mechanically supporting structure as well as an electrostatically coupled underlying layer. The metallic substrate can be etched away (e.g. using FeCl3 solution as an etchant) to leave behind a high surface area graphene-on-ionic conducting polymer as a high surface area electrode atop buried gate electrode 525. Commonly this will be further supported atop conducting supporting substrate 525. In some embodiments, conducting supporting substrate 525 may be constructed so as to have a high surface area to capacitively couple to the ionic conductivity of the ion conducting polymer material of supporting substrate 525. One example of an ionically conducting polymeric composite can be formed from the combination of polyethylene oxide (PEO) and 1-Ethyl-3methylimidazolium tetrafluoroborate (EMIBF4) or PEO or $LiClO_4$ or perfluorinated ionomers. In other embodiments, a non-polymeric ionic conductor can be utilized.

In some embodiments, buried gate electrode 125 (or buried gate electrode of supporting substrate 525) is used at stages throughout a manufacturing process in situations where liquid exposure is undesirable to enable enhanced manufacturing effectiveness. For example, devices (e.g., device 100 of FIG. 1) can be tested in solid state without exposure to any liquid sample (e.g., test solution 110) to either filter out devices that do not perform suitably, or to fine tune control parameters to optimize performance of the device. Parameters such as transconductance and Dirac point may be measured prior to contact with a liquid environment. Fabrication processes such as functionalization can also be measured in-situ using liquid gate electrode 130 and buried gate electrode 125. Use of buried gate electrode 125 for monitoring such fabrication processes is particularly useful for cases where the fabrication process is not amenable to measurement by liquid gate electrode 130 alone, such as when the liquid environment used does not support suitable conductivity for reliable liquid gate electrostatic field contact between liquid gate electrode 130 and/or thin conductive layer 115, or when fabrication is performed utilizing the deposition of functionalization materials using droplets that do not bridge between thin conductive layer 115 and liquid gate electrode 130, or when functionalization is performed via a gas or vapor phase process. Stated another way, the electrical properties of the device of the present invention may be characterized and/or measured using buried gate electrode 125 prior to the introduction of test solution 110.

Figure 6:
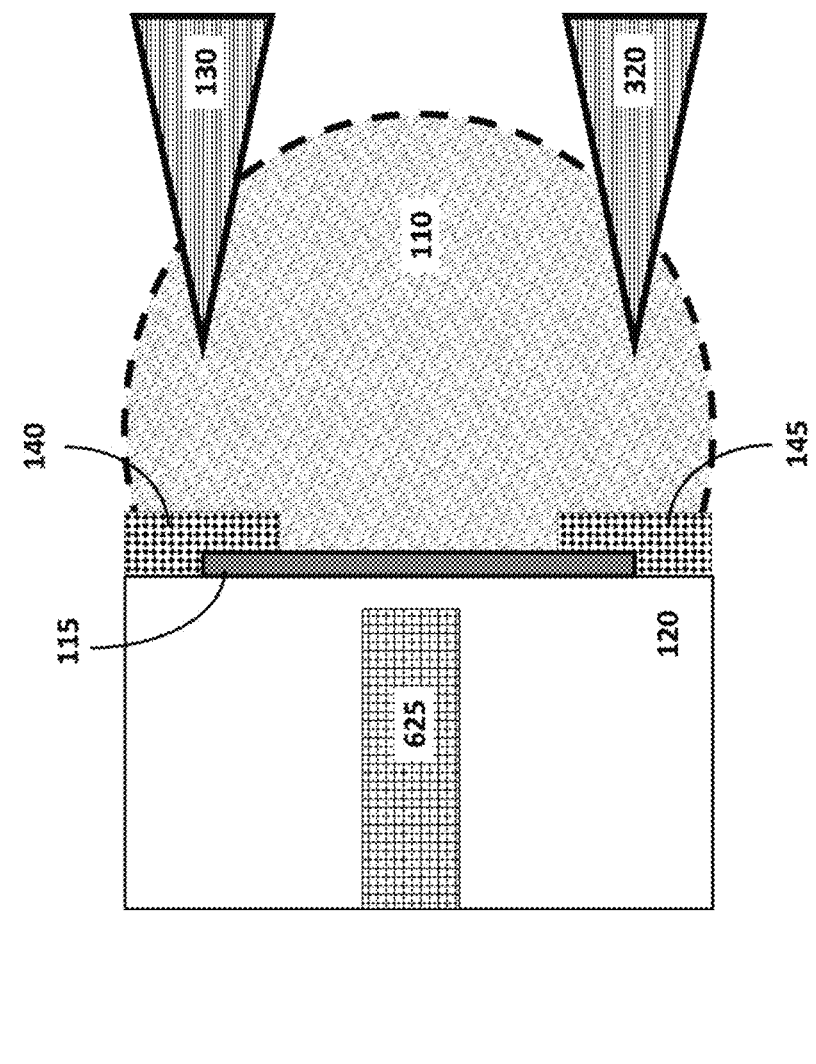
FIG. 6 is a diagram of a fifth embodiment of a device according to the present invention.

FIG. 6 illustrates a device 600 for screening a test solution, formed in accordance with the present invention. Similar to the aforementioned devices 100, 300, 400 and 500, device 600 also includes a test solution 110 (also referred to as a test sample), a thin conductive layer 115, one or more electrodes, and an intermediate material layer 120. The one or more electrodes include a buried gate electrode 625, a source electrode 140, a drain electrode 145, a liquid gate electrode 130, and a reference electrode 320. In some embodiments, reference electrode 320, source electrode 140, and drain electrode 145 are optional. Device 600 is also similar to devices 100 and 300, with the exception of the geometry of buried gate electrode 625 where buried gate electrode 625 of device 600 is primarily coupled to only a portion of thin conductive layer 115 rather than being substantially coupled to the entire thin conductive layer 115. This provides differential effects for applying localized effects to the conductive material such as localized channel gating in transistor-type operational modes.

Figure 7:
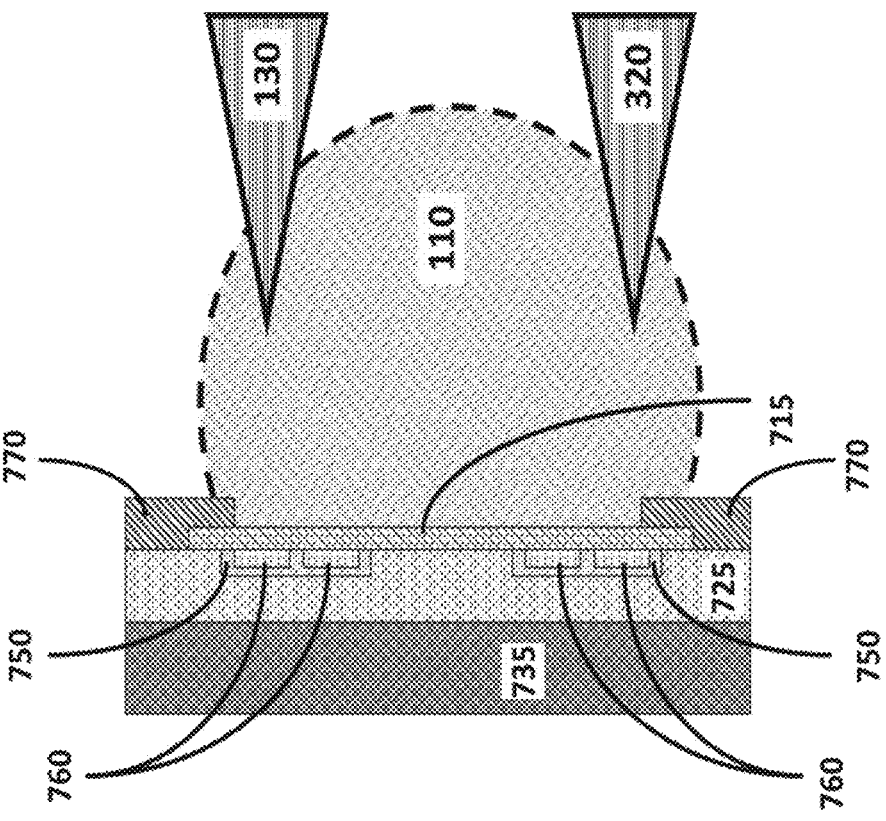
FIG. 7 is a diagram of a sixth embodiment of a device according to the present invention.

FIG. 7 illustrates a device 700 for screening a test solution, formed in accordance with the present invention. Device 700 includes a test solution 110 (also referred to as a test sample), a thin conductive layer 715, one or more contacting electrodes 760 in contact with thin conductive layer 715, an ion-conducting buried gate which also serves as a supporting substrate 725, insulating layers 750 which insulate between contacting electrodes 760 and ion-conducting buried gate of supporting substrate 725, a conducting material 735 forming an electrical contact to ion-conducting buried gate of supporting substrate 725 and passivating features 770, a liquid gate electrode 130, and a reference electrode 320. In some embodiments, reference electrode 320 and contacting electrodes 760 are optional. In some embodiments, passivation features 770 are optional. In some embodiments, insulating layer 750 may be extended to cover all space at the surface of supporting substrate 725 except for the active region of thin conductive layer 715. In some embodiments, conducting material 735 forming a contact to ion conducting material of supporting substrate 725 may be constructed in a way so that it provides a further substrate supporting the ion conducting material 735. In some embodiments, ion conducting material 735 forming a contact to the ion conducting material of supporting substrate 725 may be constructed in such a way so that it is fully encapsulated within the ion conducting material of supporting substrate 725. In some embodiments, conducting material 735 may be constructed to have a high surface area which is in contact with the ion conducting material of supporting substrate 725 to maximize the capacitance of this electrical junction. In some embodiments, insulating layers 750 are formed from non-conducting organic (e.g., polybutylene) or inorganic materials (e.g., silicon oxide). With device 700, the ion-conducting buried gated of support substrate 725 is in direct physical contact with the thin conducting layer 715, but it is operated within a particular parameter window and possesses a composition chosen such that it does not exchange charge carriers with thin conductive layer 715. This enables an electric field to accrue at the interface between the ion-conducting buried gated of support substrate 725 and thin conducting layer 715 under the influence of applied potential, without substantial current flowing across this interface. The composition of the ion-conducting buried gated of support 725 will typically be chosen to not undergo redox reactions within a particular window of applied potential and the device will commonly be operated within this potential window. In some preferred embodiments, the conduction ions will be chosen to possess large redox potential stability windows including ions such as 1-butyl-3-methylimidazolium hexafluorophosphate, lithium perchlorate, tetraethylammonium bistriflimide, and similar supporting electrolytes as known in the art. In preferred embodiments, the material of ionic conducting supporting substrate 725 will be chosen to support the conductivity of suitable conducting ions and stability under usage conditions and mixed with such conducting ions as known in the art. Many ionic conducting support materials are polymeric and many different materials have been demonstrated in the art including materials such as Nafion, PMMA, PVDf, polyvinylbutyral, polyethers such as polyoxyethylene, and epoxies. In some embodiments of the present invention, a plurality of contacts larger than two may be made to the material of thin conductive layer 715 in order to confer additional abilities for measuring electrical properties across thin conductive layer 715. By way of example but not limitation, as illustrated in FIG. 7, four contacting electrodes 760 may be made to the material to provide Kelvin-type measurements of the electrical resistance of the channel of thin conductive layer 715.

In some embodiments wherein thin conductive layer 715 is supported atop an ionic conductor material the ionic conductor material may have a propensity for being affected by contact with the test solution, e.g., by exchanging ions with the test solution and or by absorbing solution into the ionic conductor material. In some cases, this effect may be exacerbated by holes or tears within thin conductive layer 715 that create points of contact between test solution 110 and the ionic conducting supporting substrate 725. In some cases, it is advantageous to suppress this propensity. In some embodiments, this propensity may be suppressed by choosing polymeric and/or ionic species materials that have low affinity for the material of test solution 110 (for instance choosing substantially hydrophobic materials for aqueous test solution). In some embodiments, this propensity may be suppressed by creating a barrier layer between ionic conductive layer 725 and test solution 110. In some embodiments, such a barrier structure may be created selectively at the site of contact between the ionic conductor material (i.e., thin conductive layer 715) and test solution 110. By way of example but not limitation, one or more chemical reactions may be performed atop the device of the present invention that are site-specific so as to create a barrier to direct contact between the ionic conducting substrate and the test solution. Such a barrier can be created by various means and often by utilizing a self-limiting selective reaction to create a barrier substantially suppressing chemical interaction between test solution 110 and the ionic conductor of thin conductive layer 715. Such self-limiting selective reactions will in general depend upon the chemical identities of the test solution and the ionic conducting material. Examples of such suitable self-limiting reactions include site-selective deposition of inorganic materials by methods such as atomic layer deposition, liquid atomic layer deposition, low-pressure nucleation-suppressed CVD or site-selective deposition of organic materials by methods such as selective direct reactions to form quasi-self-assembled-monolayers. For example, in one embodiment, metal oxides may be terminated on hydroxyl-containing surfaces such as those presented by alkali-treated polyvinylidene or certain forms of polyvinylbutyrals and such metal oxides may be deposited via reactions such as atomic-layer-deposition from precursor pairs such as tetrachlorosilane and water vapor, or trimethylaluminum and water or via reactions such as liquid atomic-layer-deposition from precursor pairs such as titanium (iv) isopropoxide and water dissolved in an organic solvent such as toluene. In such embodiments, the treatment conditions such as temperature, time, pressure, concentration, and the like will typically be chosen to optimize the selectivity of the deposition of the barrier at the site of exposed ion conducting material while suppressing the deposition of barrier material on thin conductive layer 715. For instance, in another embodiment, inorganic layers may be formed onto carboxyl terminated surfaces such as those presented by PMMA which has been surface hydrolyzed (e.g., by alkali treatment) and may be esterified with long chain organic materials such as 10:2 fluorotelomer alcohol or linoleyl alcohol. In a preferred embodiment said long chain materials may be chosen to provide a suitable barrier between the solvent and the ion conducting supporting substrate 725 including structures such as long-chain per-fluorinated layers or layers containing readily cross-linkable bonds.

By way of example but not limitation, device 700 includes active thin conductive layer 715 constructed atop and in contact with a layer possessing mobile ionic species 725 to achieve a high degree of electrostatic coupling without electrical contact. This can be constructed in various ways. In some embodiments, it can be constructed as another liquid layer below the active thin conductive layer 715 (e.g., graphene monolayer). The active thin conductive layer 715 creates a barrier that isolates the two liquid layers from each other (e.g., the test solution 110 and supporting substrate 725 possessing a solution of mobile ionic species) and couples electrostatically to each as long as the voltage is maintained below some particular electrochemical threshold for Faradaic electron transfer.

In some cases, this voltage may also be tuned above the threshold for Faradaic electron transfer. In such cases, the electrically thin electrode (i.e., thin conductive layer 715) experiences state modulation both from the electric field and also from electron transfer between the electrically thin electrode and buried gate electrode of supporting substrate 725. This serves to alter the available population and energy spectrum characteristics of charge carriers within the electrically thin electrode layer which are then available for further interaction with the test sample. In some cases, ionic species for mediating transport between the buried electrode and the electrically thin electrode may be chosen so that electrochemical charge transfers can occur without additional chemical alteration to the chemical species or to the material of electrically thin electrode (i.e., thin conductive layer 715).

Figure 8:
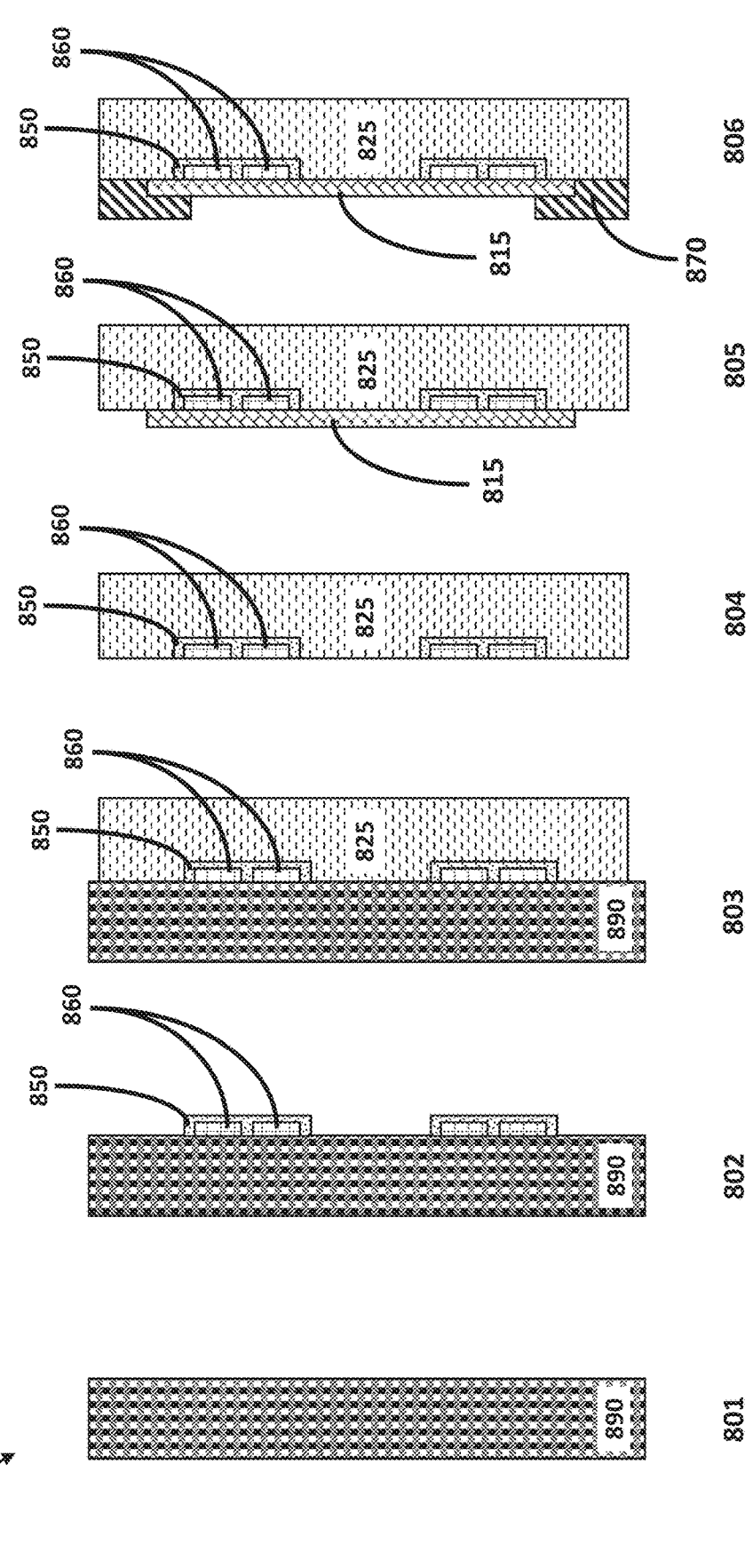
FIG. 8 is a diagram of one method for forming a device according to the present invention.

FIG. 8 illustrates a method 800 for fabricating a device for interacting with a test solution (e.g., device 700 of FIG. 7). In a first step 801, a sacrificial substrate 890 is presented. In a second step 802, contacting electrode traces 860 and an overcoating insulating layer 850 are deposited sequentially onto sacrificial substrate 890. In a third step 803, a ion conductive material 825 is conformally coated onto sacrificial substrate 890 and over contacting electrode traces 860 and insulating layer 850. Ion conductive material 825 will serve as the ion-conducting buried gate and supporting substrate. In a fourth step 804, sacrificial substrate 890 is removed to leave a bare surface behind ion conducting material 825 with embedded insulated electrode traces 850 and 860. In a fifth step 805, a thin conductive layer 815 is deposited onto the surface of ion conductive material 825 with embedded insulated electrode traces 860 and 850. In a sixth step 806, a layer of passivating features 870 is deposited atop regions of thin conducting material 815 and or ion conductive material 825 which regions are desirable to not be in direct contact with a test solution. In some embodiments, thin conductive material 815 may first be deposited over the entire surface formed from ion conductive material 825 and then lithographically patterned to restrict thin conductive material 815 to certain regions of the surface of ion conductive material 825 to form one or more active devices. In various embodiments, features such as 850, 860 and 870 may be deposited by various methods such as are known in the art including lithographic deposition, shadow masked deposition of materials, or screen printing. In some embodiments, sacrificial substrate 890 may comprise a material such as an etchable metal or metal oxide or metal salt or dissolvable polymer which can be removed by a liquid phase treatment that does not negatively impact ion conductive material 825. For instance, sacrificial layer 890 may comprise a magnesium oxide layer which is dissolved by an acidic solution, or a polylactic acid which is dissolved by an alkaline solution or polyvinyl alcohol which is dissolved by aqueous solution or sodium chloride which is dissolvable by an aqueous solution or wax which is dissolvable in an alkane solvent.

Figure 9:
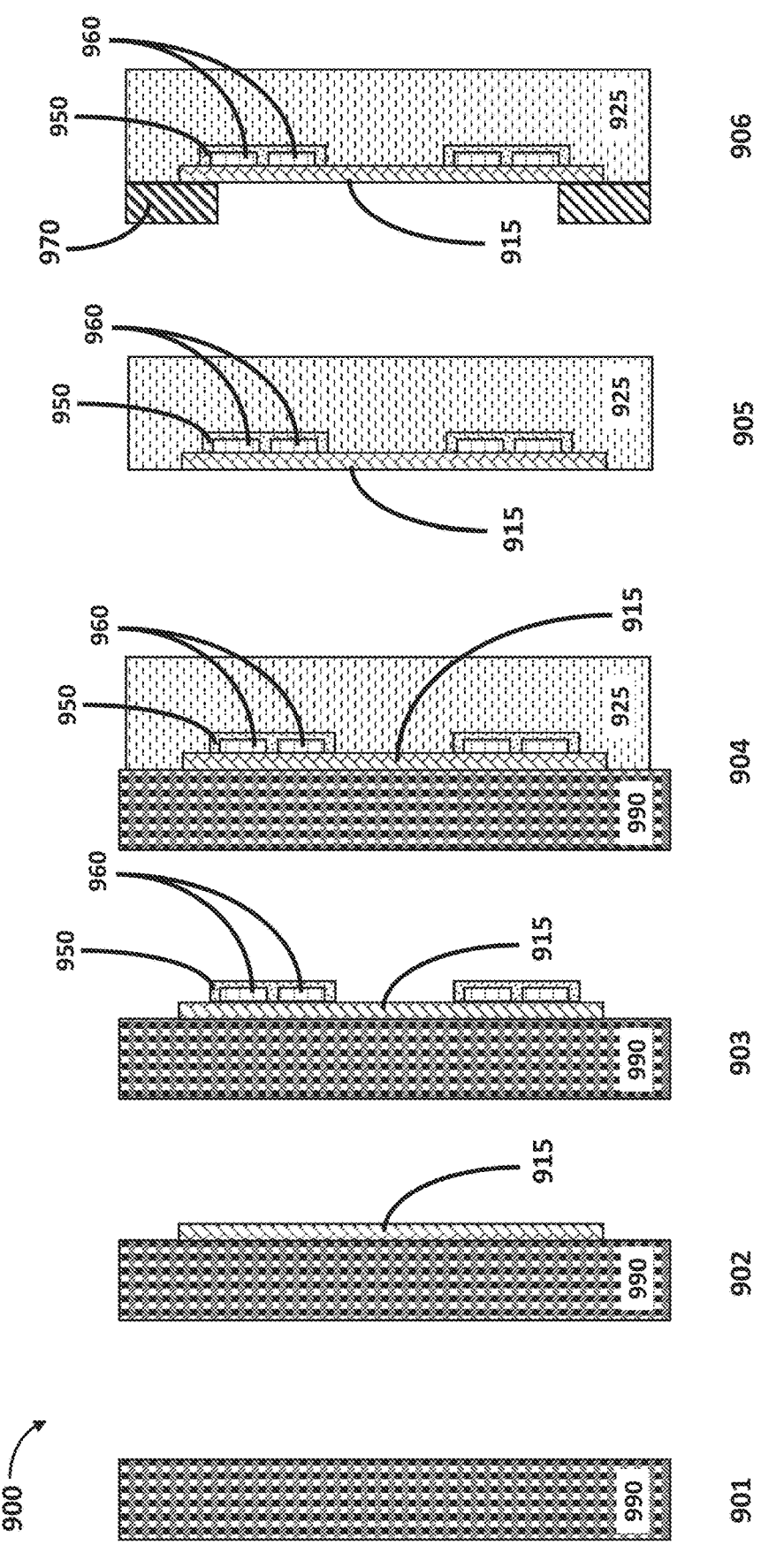
FIG. 9 is a diagram of a second method for forming a device according to the present invention.

FIG. 9 illustrates a second method 900 for fabricating a device for interacting with a test solution (e.g., device 700 of FIG. 7). In a first step 901, a sacrificial substrate 990 is presented. In a second step 902, a thin conductive material 915 is deposited onto the surface of sacrificial substrate 990. In a third step 903, contacting electrode traces 960 and an overcoating insulating layer 950 are deposited onto thin conductive layer 915 on the sacrificial substrate 990. In a fourth step 904, an ion conductive material 925 is conformally coated onto sacrificial substrate 990 and over thin conductive layer 915 and over top of the contacting electrode traces 960 and insulating layer 950. In a fifth step 905, sacrificial substrate 990 is removed to leave behind a device consisting of thin conductive material 915 and insulated electrode traces 960 and 950 supported atop an ionic conducting material 925. In a sixth step 906, a layer of passivating features 970 is deposited atop regions of thin conductive material 915 and/or ion conductive material 925 which regions are desirable to not be in direct contact with a test solution. In various embodiments, features such as 950, 960 970 may be deposited by various methods such as are known in the art including lithographic deposition, shadow masked deposition of materials, or screen printing. In some embodiments, thin conductive material 915 may be deposited over the entire surface formed from ion conductive material 925 and then lithographically patterned to restrict thin conductive material 915 to certain regions of the surface of ion conductive material 925 to form one or more active devices. In some embodiments, sacrificial substrate 990 may comprise a catalytic substrate for the direct formation of thin conductive material 915 such as copper or nickel for graphene monolayers which are commonly etchable by suitable solutions of $FeCl_3$.

Although specific embodiments are described above, changes may be made within the spirit and scope of the concepts described. For example, the devices described herein can be formed in a variety of sizes and materials. Further features and advantages based on the above-described embodiments are also possible and within the scope of the present disclosure. Accordingly, the disclosure is not to be limited by what has been particularly shown and described. All publications and references cited herein are incorporated by reference in the entirety, except for any definitions, subject matter disclaimers or disavowals, and except to the extent that the incorporated material is inconsistent with the express disclosure herein, in which case the language in this disclosure controls.

What is claimed is:

1. A method for interacting with a quantity of a sample, the method comprising:

providing a device comprising:
a substrate comprising a first surface and a second surface, wherein the first surface is opposite to the second surface;
conductive layer disposed on the first surface of the substrate and configured to contact a first portion of the sample;
a buried electrode disposed on the second surface of the substrate, the buried electrode being capacitively coupled with the conductive layer; and
at least one electrode in contact with a second portion of the sample, wherein the second portion of the sample is remote from the first portion of the sample, and further wherein the at least one electrode and the conductive layer electrically interact via the sample;
wherein the substrate is configured such that the substrate does not substantially conduct flow of electric current between the conductive layer and the buried electrode; and
applying electrical signals simultaneously to the buried electrode, the conductive layer, and the at least one electrode in contact with the second portion of the sample, wherein the electrical signals simultaneously applied to the buried electrode, the conductive layer, and the at least one electrode in contact with the second portion of the sample are each independently controlled and time-varying.

2. The method of claim 1, wherein the conductive layer comprises graphene.

3. The method of claim 1, wherein the sample comprises at least one of a solid and a liquid that conducts electrical current as an ionized chemical species.

4. The method of claim 1, wherein the substrate comprises a dielectric material.

5. The method of claim 1, wherein the substrate comprises an ionic conducting material.

6. The method of claim 1, further comprising providing sensed information responsive to a chemical composition of the sample.

7. The method of claim 1, further comprising flowing electrical current through the sample to alter a chemical property of the sample.

8. The method of claim 1, wherein the device is configured to interact with the sample in a manner of one selected from the group consisting of a chemical field-effect transistor (ChemFET)-type device, an electrochemical-FET (EChemFET)-type device, and an electrochemical-type device.

9. The method of claim 1, wherein the device further comprises a plurality of electrical leads disposed in contact with the conductive layer to form an electrically conducting channel through the conductive layer.

10. The method of claim 1, wherein the at least one electrode comprises at least one reference electrode.

11. The method of claim 1, wherein at least one species of sensitizing chemical species is disposed on a surface of the at least one electrode.

12. The method of claim 1, wherein one or more species of redox active chemical species is disposed on a surface of the at least one electrode.

13. The method of claim 1, wherein functional behavior of the conductive layer in contact with the sample is modulated by simultaneously applying current to the buried electrode and the at least one electrode.

14. The method of claim 1, wherein the buried electrode is not in direct physical contact with the sample.

15. The method of claim 1, wherein the device further comprises a plurality of electrical leads disposed in contact with the conductive layer to form an electrically conducting channel through the conductive layer; and further comprising measuring electrical properties of the conducting channel as a function of the electrical signals applied simultaneously to the buried electrode, the conductive layer, and the at least one electrode, whereby to determine a chemical property of the sample.

16. The method of claim 1, wherein the electrical signals applied simultaneously to the conductive layer, the buried electrode, and the at least one electrode vary periodically over time.

17. The method of claim 1, wherein applying the electrical signals results in modification of at least one of the properties from the group consisting of a charge double layer at an interface between the conductive layer and the sample, a redox potential of the conductive layer, a charge transport dynamics between the conductive layer and the sample, and conductivity within the conductive layer.

18. The method of claim 1, wherein applying the electrical signals modulates contributions in dynamics from at least one of the Levich exclusion effect and the Frumkin effect.

19. The method of claim 1, wherein the substrate comprises a layer of redox-active species in contact with the conductive layer and opposite to the sample.

20. A method for selectively transforming chemical properties of a quantity of a sample, the method comprising:

providing a device comprising:
a substrate comprising a first surface and a second surface, wherein the first surface is opposite to the second surface;
a graphene layer disposed on the first surface of the substrate and configured to contact a first portion of the sample;
a buried electrode disposed on the second surface of the substrate, the buried electrode being capacitively coupled with the graphene layer; and
at least one electrode in contact with a second portion of the sample, wherein the second portion of the sample is remote from the first portion of the sample, and further wherein the at least one electrode and the graphene layer electrically interact via the sample;
wherein the substrate is configured such that the substrate does not substantially conduct flow of electric current between the graphene layer and the buried electrode; and
applying electrical signals simultaneously to the buried electrode, the graphene layer, and the at least one electrode in contact with the second portion of the sample,
wherein the electrical signals simultaneously applied to the buried electrode, the graphene layer, and the at least one electrode in contact with the second portion of the sample are each independently controlled and time varying, wherein the applied electrical signals modulate charge transfer between the graphene layer and the sample, and wherein the applied electrical signals induce the Frumkin effect and the Levich exclusion effect.

21. The method of claim 20, wherein the substrate comprises a layer of redox-active species in contact with the graphene layer and opposite to the sample.

22. The method of claim 20, wherein the graphene layer comprises a non-planar geometry.

* * * * *